United States Patent
Kasaoka

(10) Patent No.: US 9,887,233 B2
(45) Date of Patent: Feb. 6, 2018

(54) SEMICONDUCTOR DEVICE AND MANUFACTURING METHOD THEREFOR

(71) Applicant: Renesas Electronics Corporation, Kawasaki-shi, Kanagawa (JP)

(72) Inventor: Tatsuo Kasaoka, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 4 days.

(21) Appl. No.: 14/747,065

(22) Filed: Jun. 23, 2015

(65) Prior Publication Data

US 2016/0013239 A1    Jan. 14, 2016

(30) Foreign Application Priority Data

Jul. 9, 2014   (JP) ................. 2014-141369

(51) Int. Cl.
*H01L 27/146* (2006.01)

(52) U.S. Cl.
CPC .. *H01L 27/14643* (2013.01); *H01L 27/14603* (2013.01); *H01L 27/14609* (2013.01); *H01L 27/14612* (2013.01); *H01L 27/14627* (2013.01); *H01L 27/14636* (2013.01); *H01L 27/14641* (2013.01); *H01L 27/14689* (2013.01)

(58) Field of Classification Search
CPC ......... H01L 27/14636; H01L 27/14678; H01L 27/14601
See application file for complete search history.

(56) References Cited

U.S. PATENT DOCUMENTS

| 7,411,170 B2 | 8/2008 | Shimotsusa et al. |
| 7,935,995 B2 | 5/2011 | Watanabe et al. |
| 2011/0249163 A1* | 10/2011 | Ikeda ................ H01L 27/14609 348/308 |

FOREIGN PATENT DOCUMENTS

| JP | 2008-41689 A | 2/2008 |
| JP | 2008-60356 A | 3/2008 |

* cited by examiner

*Primary Examiner* — Jae Lee
(74) *Attorney, Agent, or Firm* — Sughrue Mion, PLLC

(57) ABSTRACT

Disclosed are a semiconductor device and a method for manufacturing the semiconductor device that is capable of adequately reducing the influence of inter-wiring capacitance even when a photoelectric conversion element is progressively miniaturized. A plurality of transfer transistors each include a photoelectric conversion element and a signal output section. A plurality of other transistors include at least one signal input/output section that is electrically coupled to the transfer transistors. An interlayer insulating film is formed so as to cover the transfer transistors and the other transistors. A total of at least three of at least one signal output section of the transfer transistors and at least one signal input/output section of the other transistors are coupled by a coupling layer that includes a conductor filled into a groove formed in the interlayer insulating film.

6 Claims, 40 Drawing Sheets

SEMICONDUCTOR DEVICE AND MANUFACTURING METHOD THEREFOR

CROSS-REFERENCE TO RELATED APPLICATIONS

The disclosure of Japanese Patent Application No. 2014-141369 filed on Jul. 9, 2014 including the specification, drawings, and abstract is incorporated herein by reference in its entirety.

BACKGROUND

The present invention relates to a semiconductor device and a manufacturing method therefor, and more particularly to a semiconductor device including a photodiode or other photoelectric conversion element and a manufacturing method therefor.

Sensor characteristics of a semiconductor device including a photodiode or other photoelectric conversion element are tremendously affected by the magnitude of inter-wiring capacitance generated between a plurality of wires included in the semiconductor device. Particularly due to the miniaturization, for example, of photoelectric conversion elements in recent years, inter-wiring capacitance increases with a decrease in the spacing interval between wires. This increases the possibility of unintentionally changing the characteristics of the semiconductor device, thereby lowering the sensitivity, for instance, of a photoelectric conversion element or causing another problem. Further, if the spacing interval between wires is narrowed, it is highly likely that an electric short circuit will occur between the wires.

As such being the case, two or more floating nodes included in a semiconductor device having a photoelectric conversion element described in Japanese Unexamined Patent Application Publication No. 2008-41689 are coupled with a wiring that is in the same layer as a gate electrode. Thus, the area of the photoelectric conversion element can be increased to raise the sensitivity of the photoelectric conversion element.

Meanwhile, a configuration described in Japanese Unexamined Patent Application Publication No. 2008-60356 is formed to electrically couple the gate electrode of an amplifier metal oxide semiconductor (MOS) transistor to a surrounding floating diffusion by disposing a conductor in a single contact hole.

SUMMARY

When a plurality of floating nodes are coupled by routing a wiring disposed in the same layer as a gate electrode as described in Japanese Unexamined Patent Application Publication No. 2008-41689, inter-wiring capacitance generated between the wiring in the same layer as the gate electrode and an underlying wiring may exert significant influence. Further, it may be difficult to obtain an adequate spacing interval between the wiring and the gate electrode adjacent to it. As a result, non-negligible inter-wiring capacitance may be generated between the wiring and the gate electrode adjacent to it.

According to Japanese Unexamined Patent Application Publication No. 2008-60356, a single conductor is used to couple only two nodes, namely, the gate electrode of the amplifier MOS transistor and the surrounding floating diffusion. Using a single conductor to couple three or more nodes is not described in Japanese Unexamined Patent Application Publication No. 2008-60356. Therefore, it is possible that an inadequate effect may be produced to reduce the influence of inter-wiring capacitance. Further, even if the conductor in the contact hole electrically couples a wiring in a certain layer to a wiring in an upper layer, it may be difficult to establish an improved positional relationship between the conductor and the wiring in the upper layer when a photoelectric conversion element, in particular, is progressively miniaturized. This may impair the positional relationship between the conductor and the wiring in the upper layer.

Other problems and novel features will become apparent from the following description and from the accompanying drawings.

According to an aspect of the present invention, there is provided a semiconductor device including a semiconductor substrate, a plurality of transfer transistors, and a plurality of other transistors. The transfer transistors each include a photoelectric conversion element and a signal output section. The other transistors each include at least one signal input/output section that is electrically coupled to the transfer transistors. An interlayer insulating film is formed so as to cover the transfer transistors and the other transistors. A total of three or more of at least one signal output section of the transfer transistors and at least one signal input/output section of the other transistors are coupled with a coupling layer that includes a conductor filled into a groove formed in the interlayer insulating film.

According to another aspect of the present invention, there is provided a manufacturing method for a semiconductor device. The manufacturing method includes the steps of: forming a plurality of transfer transistors in such a manner as to include a photoelectric conversion element and a signal output section that are formed in a semiconductor substrate; forming a plurality of other transistors including at least one signal input/output section over a main surface in such a manner as to be electrically coupled to the transfer transistors; forming an interlayer insulating film in such a manner as to cover the transfer transistors and the other transistors; and forming a coupling layer by filling a conductor into a groove formed to extend from one main surface of the interlayer insulating film to the other main surface. The coupling layer is formed to come into contact with the upper surfaces of a total of three or more of at least one signal output section of the transfer transistors and at least one signal input/output section of the other transistors.

According to an aspect of the present invention, it is possible to provide a semiconductor device that is capable of adequately reducing the influence of inter-wiring capacitance even when a photoelectric conversion element is progressively miniaturized. According to another aspect of the present invention, it is possible to provide a manufacturing method for such a semiconductor device.

BRIEF DESCRIPTION OF THE DRAWINGS

Embodiments of the present invention will be described in detail based on the following figures, in which.

DETAILED DESCRIPTION

Embodiments of the present invention will now be described with reference to the accompanying drawings.

First Embodiment

First of all, the arrangement of element formation regions of a main surface of a semiconductor substrate of a semiconductor device according to a first embodiment of the present invention will be described with reference to FIGS. 1 and 2.

Figure 1:
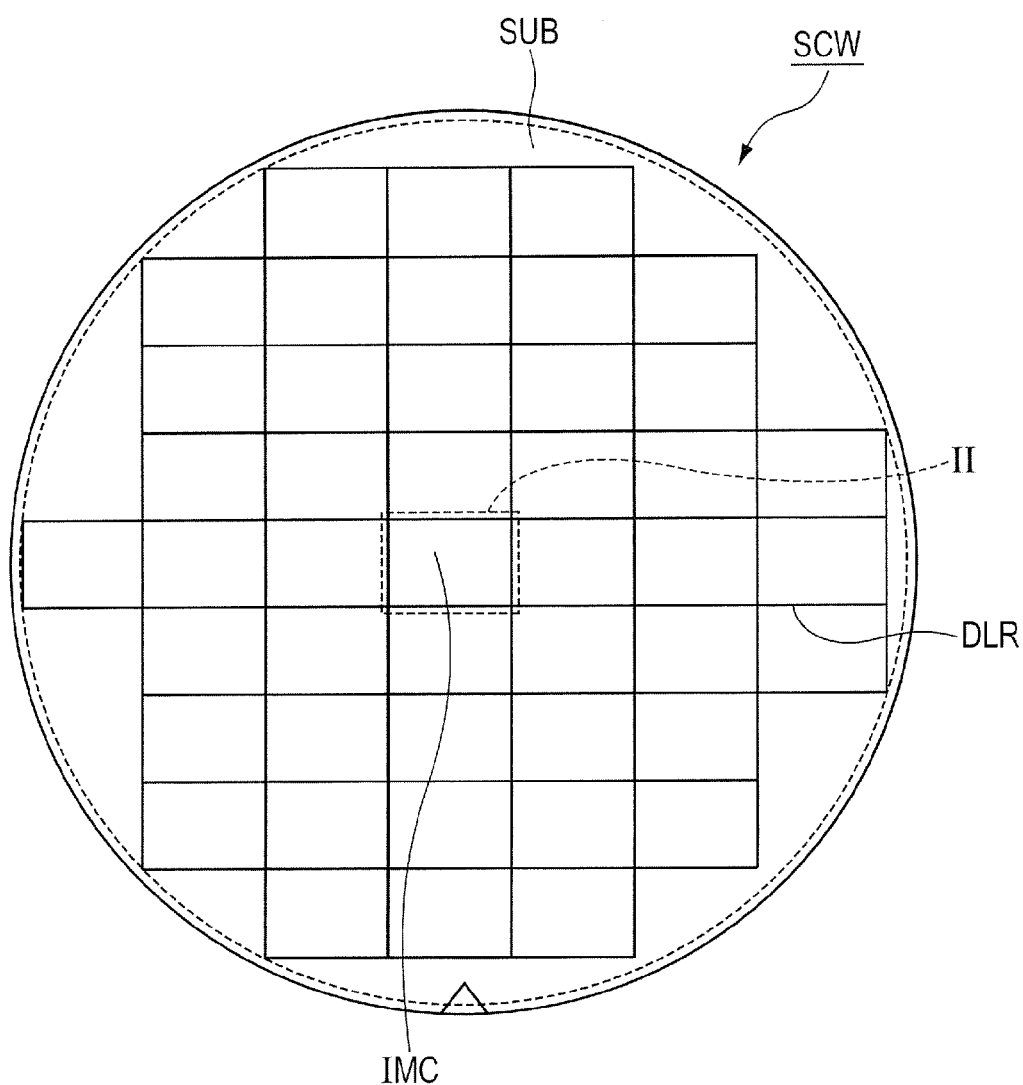
FIG. 1 is a schematic plan view illustrating the condition of a wafer that provides a semiconductor device according to an embodiment of the present invention.

Referring to FIG. 1, the semiconductor device is formed over a semiconductor wafer SCW that uses a semiconductor substrate SUB as its base. A plurality of image sensor chip regions IMC are formed over the semiconductor wafer SCW. The chip regions IMC, which are in a rectangular planar shape, are arranged in a matrix format. A dicing line region DLR is formed between the chip regions IMC.

Figure 2:
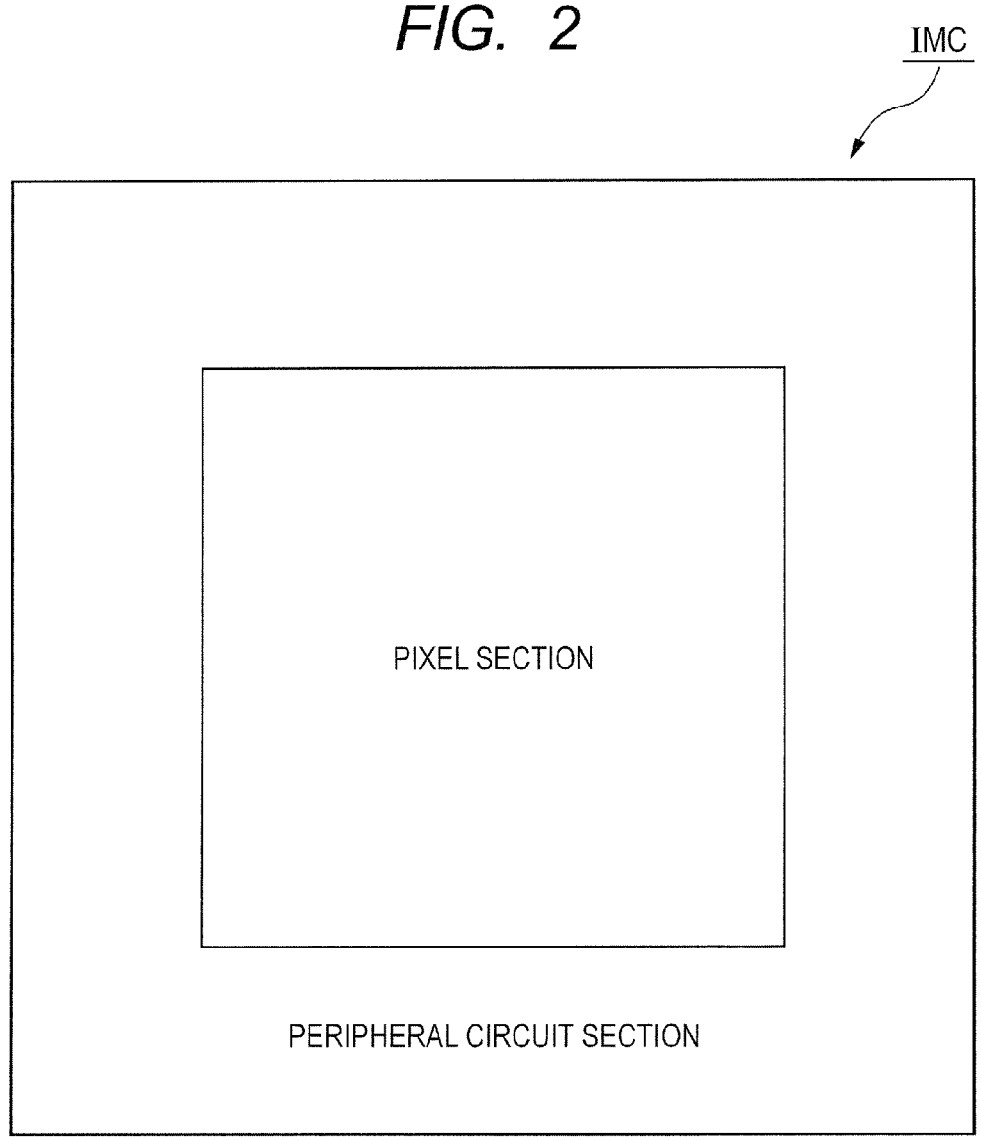
FIG. 2 is a schematic diagram illustrating region II, which is enclosed by a broken line in FIG. 1.

Referring to FIG. 2, the chip regions IMC each include a pixel section and a peripheral circuit section. The pixel section is formed in the center of each chip region IMC. The peripheral circuit section is formed in a region surrounding the pixel section.

Figure 3:
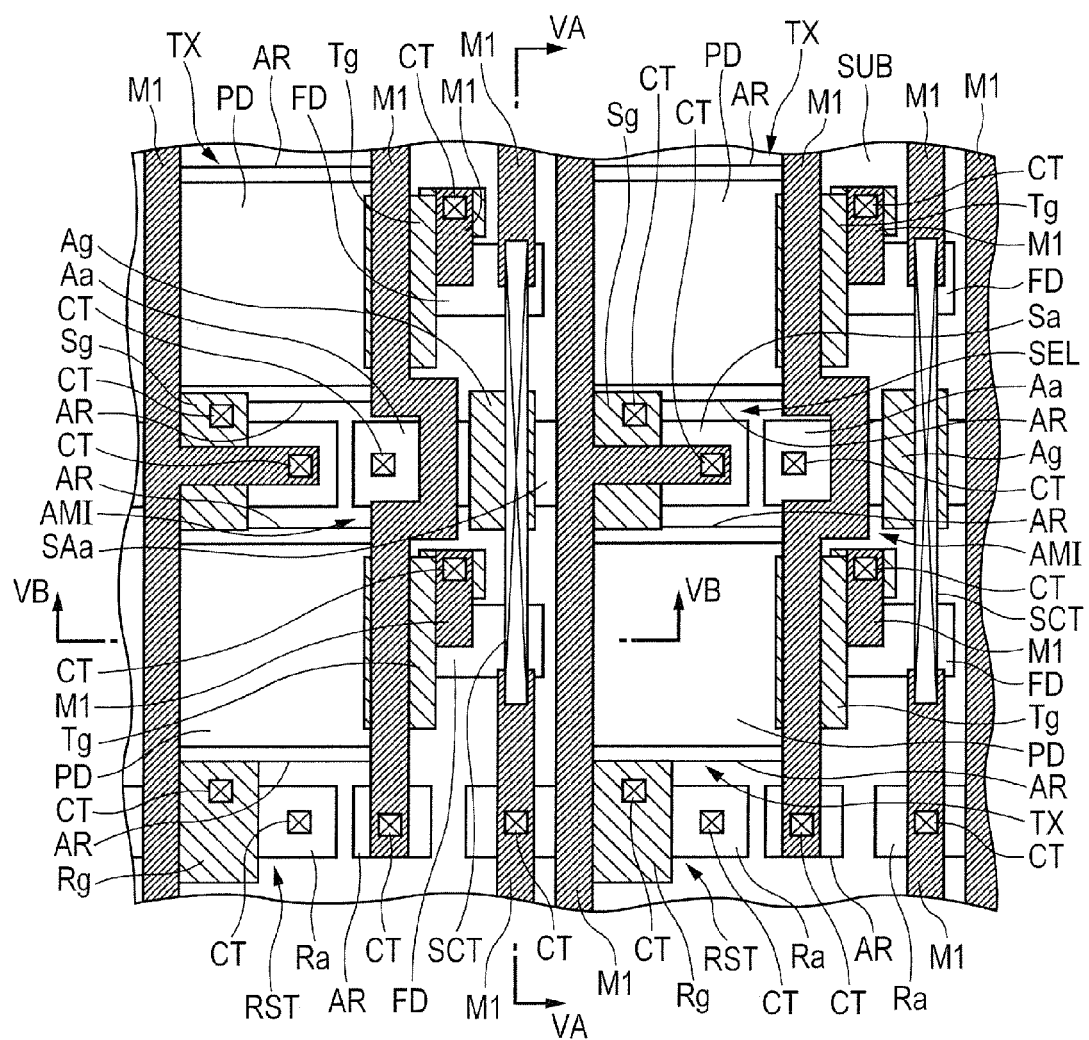
FIG. 3 is a schematic plan view illustrating a configuration of a pixel section according to a first embodiment of the present invention.

Next, a configuration of the pixel section according to the first embodiment will be described with reference to FIGS. 3, 4, 5A, and 5B. Referring to FIGS. 3, 4, 5A, and 5B, in the present embodiment, the pixel section shown in FIG. 2 mainly includes a transfer transistor TX, an amplifying transistor AMI, a reset transistor RST, and a selection transistor SEL. In a region shown in FIG. 3, for example, four transfer transistors TX, one amplifying transistor AMI, one reset transistor RST, and one selection transistor SEL are disposed over the main surface of the semiconductor substrate SUB. The arrangement shown in FIG. 3 is formed in plurality, that is, for example, repeatedly formed in a matrix format, over the main surface of the semiconductor substrate SUB.

The transfer transistor TX includes a portion of a photodiode PD that serves as a photoelectric conversion region. The portion of the photodiode PD represents a region that is formed when a p-n junction is formed between a surface p-type region SPR formed in the semiconductor substrate SUB and an n-type region NR in contact with the surface p-type region SPR. A total of four transfer transistors TX, two vertical and two horizontal, are disposed in the region shown in FIG. 3.

The photodiode PD, which serves as a photoelectric conversion element, uses the p-n junction to convert received light to an electric signal, that is, an electric charge such as electrons. In other words, the transfer transistor TX functions as a transistor that converts the electric charge derived from the photodiode PD to a voltage and transfers the voltage to another transistor (for example, the amplifying transistor AMI). The photodiode PD is formed in each of a plurality of active regions AR formed over the main surface of the semiconductor substrate SUB.

More specifically, the transfer transistor TX includes the photodiode PD, a transfer gate electrode Tg, and a floating diffusion region FD. The photodiode PD is a region that supplies an electric charge upon receipt of light. Therefore, the photodiode PD corresponds to the source region of a general MOS transistor. The transfer gate electrode Tg corresponds to the gate electrode of a general MOS transistor and has the same function as the gate electrode of a general MOS transistor. The floating diffusion region FD converts an electric charge supplied from the photodiode PD to an electric signal (voltage) and transfers the electric signal to another transistor. Thus, the floating diffusion region FD is an electric signal output region (signal output section) that corresponds to the drain region of a general MOS transistor. Further, the floating diffusion region FD can be regarded not only as an electric charge storage capacity region that temporarily stores an electric charge supplied from the photodiode PD of the transfer transistor TX, but also as a signal output section that outputs an electric signal to the outside from the inside of the transfer transistor TX. Consequently, the transfer transistor TX can be regarded, on the whole, as having the same configuration as a MOS transistor.

Referring to FIG. 3, the transfer transistor TX is configured so that the photodiode PD, the transfer gate electrode Tg, and the floating diffusion region FD are collinearly arranged in the order named from left to right. When viewed from above, the area of the photodiode PD is larger than the area of the floating diffusion region FD. Referring to FIG. 3, as viewed from above, the vertical width of the photodiode PD is greater than the vertical width of the floating diffusion region FD.

The reset transistor RST, the amplifying transistor AMI, and the selection transistor SEL are disposed around the transfer transistor TX and configured the same as a general MOS transistor. Referring to FIG. 3, a reset active region Ra where, for example, the source/drain region of the reset transistor RST is disposed, an amplifying active region Aa where, for example, the source/drain region of the amplifying transistor AMI is disposed, and a selection active region Sa where, for example, the source/drain region of the selection transistor SEL is disposed are extended in left-right direction and in a linear planar shape. The reset transistor RST, the amplifying transistor AMI, and the selection transistor SEL each include a reset gate electrode Rg, an amplifying gate electrode Ag, and a selection gate electrode Sg, all of which are extended in up-down direction of FIG. 3.

Figure 4:
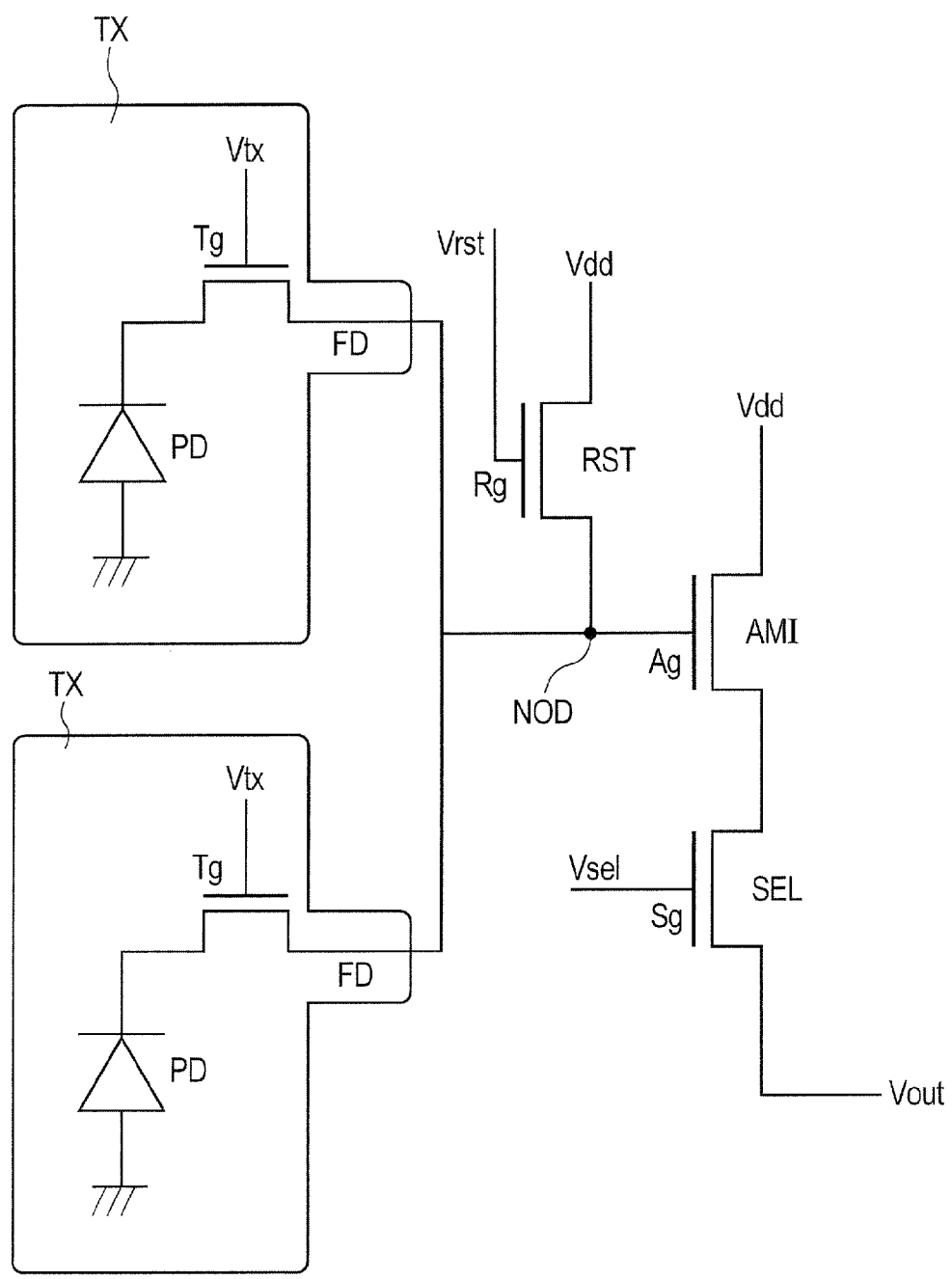
FIG. 4 is a circuit diagram illustrating a configuration of the pixel section shown in FIG. 3.

Referring to FIGS. 3 and 4, the region FD of the upper left one of the four transfer transistors TX shown in FIG. 3, the amplifying gate electrode Ag, the region FD of the lower left one of the four transfer transistors TX, and a portion of the reset active region Ra are collinearly arranged in up-down direction of the figure. The upper left region FD, the amplifying gate electrode Ag, and the lower left region FD are electrically coupled to each other by a shared contact SCT that serves as a coupling layer. Referring to FIG. 3, the region FD of the upper right one of the four transfer transistors TX, the amplifying gate electrode Ag, the region FD of the lower right one of the four transfer transistors TX, and a portion of the reset active region Ra are also collinearly arranged in up-down direction of the figure, and electrically coupled to each other by the shared contact SCT that serves as a coupling layer.

The shared contact SCT is disposed in contact with (laid over) the upper surface of the above-mentioned two regions FD and of the amplifying gate electrode Ag. The shared contact SCT plays a role of forming a node NOD shown in FIG. 4. The node NOD electrically couples all three of them so that they are at the same potential. Referring to the circuit diagram of FIG. 4, the node NOD is a wiring intersection that is formed by coupling the terminals of each transistor, such as the gate electrode, the source region, and the drain region.

The gate electrode, source region, and drain region of transistors RST, AMI, SEL other than the transfer transistor TX, which are the terminals of the transistors, are signal input/output sections that input an electric signal from and output an electric signal to the outside. Here, the amplifying gate electrode Ag, which is directly coupled to the node NOD (covered with the shared contact SCT), particularly corresponds to a signal input/output section.

Figure 5A:
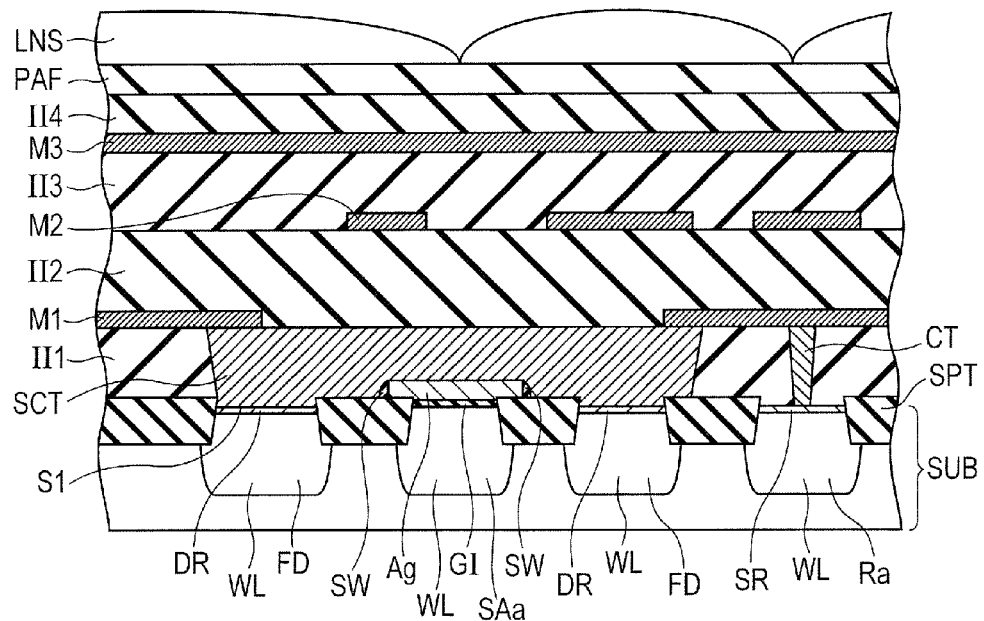
FIG. 5A is a schematic cross-sectional view of a portion taken along line VA-VA of FIG. 3.

Referring to FIGS. 3 and 5A, an interlayer insulating film II1 made, for instance, of silicon oxide film is formed over the transfer transistors TX and the other transistors AMI, RST, SEL, which are disposed over a main surface S1 of the semiconductor substrate SUB. The shared contact SCT is formed to penetrate the interlayer insulating film II1 by being extended from one main surface (the uppermost surface shown in FIG. 5A) of the interlayer insulating film II1 to the opposing other main surface (the lowermost surface shown in FIG. 5A).

The shared contact SCT is formed of a conductor filled into a groove called a shared via SVA. The shared via SVA is formed by being extended from one main surface of the interlayer insulating film II1 to the other main surface. It is preferred that the conductor filled into this groove SVA be formed of a metal material. For example, the conductor may be formed of tungsten or formed of copper. Particularly, if the shared contact SCT is formed of a conductor made of copper, it is preferred that the shared contact SCT be formed by a so-called damascene process.

The shared contact SCT is formed so as to cover not only drain regions DR formed over the surfaces of the floating diffusion regions FD included in two out of a plurality of transfer transistors TX arranged in a matrix format, but also the amplifying gate electrode Ag of the amplifying transistor AMI, which is disposed between the drain regions DR. The drain region DR of each transfer transistor TX, which functions as the floating diffusion region FD, is formed as a conductive impurity region that is a portion of the surface of a well region WL formed in the semiconductor substrate SUB.

A patterned, first-layer (lowermost layer) wiring M1 is formed so as to come into contact with a portion of the uppermost surface of the shared contact SCT. This wiring M1 electrically couples the shared contact SCT to, for example, a portion of the reset active region Ra of the reset transistor RST with a contact CT interposed therebetween. The portion of the reset active region Ra corresponds, for example, to the source region of the reset transistor RST, and is formed as a conductive impurity region that is a portion of the surface of the well region WL formed in the semiconductor substrate SUB. This is indicated by the circuit diagram of FIG. 4 in which the source region of the reset transistor RST is directly coupled to a node NOD that corresponds to the shared contact SCT.

When viewed from above, the width of the wiring M1 in a direction intersecting its direction of extension is greater than the width of the shared contact SCT in a direction intersecting the direction of its extension. Therefore, the wiring M1, which is in contact with a portion of the uppermost surface of the shared contact SCT, is disposed to protrude from the shared contact SCT at its widthwise edge.

Further, as shown in FIG. 3, a portion of the amplifying active region Aa (for example, the source region) overlaps with a portion of the selection active region Sa (for example, the source region) to form an active region SAa. This ensures that the amplifying transistor AMI and the selection transistor SEL are disposed contiguously to each other in left-right direction of the figure. FIG. 4 also indicates that the source region of the amplifying transistor AMI and the source region of the selection transistor SEL are coupled to each other.

Consequently, all of the transistors around a transfer transistor TX, namely, the reset transistor RST, the amplifying transistor AMI, and the selection transistor SEL, are electrically coupled to the transfer transistor TX by the shared contact SCT and, for example, the wiring M1 around it.

Moreover, referring again to FIG. 3, a wiring M1 that is in the same layer as the above-described wiring M1 is disposed to pass, for example, directly above the transfer gate electrode Tg and directly above a portion of the amplifying active region Aa. This wiring M1 is extended to stay clear of the contact CT formed in contact with a region (for example, the source region) positioned to the left of the amplifying active region Aa because this wiring M1 is bent in its extension direction within a region adjacent to a region directly above the amplifying active region Aa. The contact CT formed in contact with the upper surface of a region positioned to the left of the amplifying active region Aa (for example, the source region) and of a region positioned to the right of the reset active region Ra (for example, the drain region) electrically couples these active regions Aa, Ra to an upper conductive layer not shown (for example, a wiring).

In addition, a wiring M1 that is in the same layer as the above-described wiring M1 may be linearly extended in up-down direction of the figure in such a manner as to pass directly above a left edge of the photodiode PD. Further, in the transfer transistor TX, a part of the transfer gate electrode Tg is electrically coupled to the wiring M1 through the contact CT that is disposed in contact with the upper surface of the transfer gate electrode Tg.

Referring again to FIG. 4, which illustrates the elements shown in FIG. 3, when the pixel section shown in FIG. 3 is to be driven, a transfer gate voltage Vtx is applied to the transfer gate electrode Tg, a reset gate voltage Vrst is applied to the reset gate electrode Rg, and a selection gate voltage Vsel is applied to the selection gate electrode Sg. Further, a drain voltage Vdd is applied to the drain regions of the reset transistor RST and amplifying transistor AMI, and a drain voltage Vout is applied to the drain region of the selection transistor SEL.

Figure 5B:
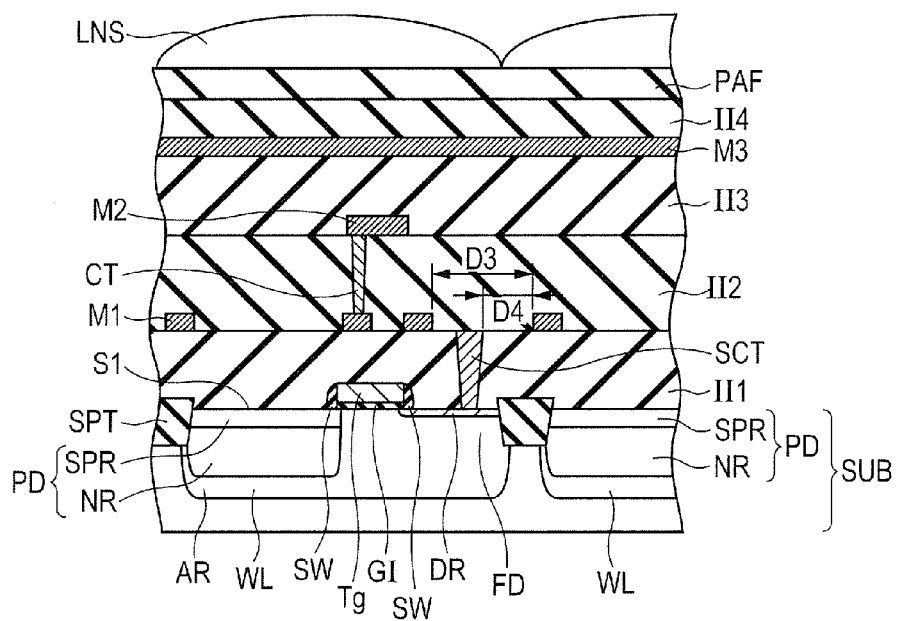
FIG. 5B is a schematic cross-sectional view of a portion taken along line VB-VB of FIG. 3.

Referring again to FIGS. 5A and 5B, the well region WL into which conductive impurities are implanted is formed in the semiconductor substrate SUB as a base for configuring, for example, the photodiode PD and floating diffusion region FD of the transfer transistor and the reset active region Ra of the reset transistor. As shown in FIG. 5B, the well region WL also functions as a base for configuring another arbitrary active region AR.

The contact CT shown in FIG. 5A is formed in a groove formed in the interlayer insulating film II1 as a layer basically identical with the shared contact SC. Therefore, the material of the contact CT is basically the same as that of the shared contact SCT, and more specifically, for example, the aforementioned tungsten or copper. The contact CT shown in FIG. 5A is coupled in contact, for example, with the upper surface of a source region SR that is a portion of the reset active region Ra.

A plurality of well regions WL are formed in the semiconductor substrate SUB. However, a separating insulating film SPT is formed in a region between a pair of neighboring well regions WL. The separating insulating film SPT may be made, for instance, of silicon oxide film and formed in the semiconductor substrate SUB from the main surface S1 of the semiconductor substrate SUB in such a manner as to protrude slightly upward from the main surface S1 of the semiconductor substrate SUB.

As shown in FIG. 5A, the amplifying gate electrode Ag, which is included in the amplifying transistor, is formed over the main surface S1 of the semiconductor substrate SUB with a gate insulating film GI interposed therebetween. A sidewall insulating film SW made, for instance, of silicon oxide film and silicon nitride film, is formed over the sidewall of the amplifying gate electrode Ag.

As shown in FIG. 5B, in a region where the transfer transistor is formed, the photodiode PD acting as a source region and the floating diffusion region FD acting as a drain region DR are formed over the main surface S1 of the semiconductor substrate SUB and spaced apart from each other. The drain region DR is formed, for instance, as an n-type conductive impurity region. The transfer gate electrode Tg is formed over the main surface S1 of the semiconductor substrate SUB that is sandwiched between the photodiode PD corresponding to the source region and the drain region DR. The transfer gate electrode Tg is formed over the main surface S1 with the gate insulating film GI interposed therebetween. A sidewall insulating film SW made, for instance, of silicon oxide film and silicon nitride film, is formed over the sidewall of the transfer gate electrode Tg as a residue of antireflection film.

As described above, the pixel section is configured so that the elements shown in FIGS. 3 and 5A are repeatedly formed, for instance, in a matrix format. Therefore, the wiring M1 covering a portion of the upper surface of the interlayer insulating film II1 and a portion of the upper surface of the shared contact SCT and contact CT is not cut at the uppermost section of FIG. 3 (the leftmost end of FIG. 5A) or at the lowermost section of FIG. 3 (the rightmost end of FIG. 5A), but is extended to a subsequent region not shown in the figures. Therefore, when viewed from above, the wiring M1 (an extension of the shared contact SCT) is long enough to overlap with the floating diffusion region FD and with the reset active region Ra.

Referring to FIGS. 3 and 5B, the wiring M1 is disposed at left-right spacing intervals indicated in the figures.

Referring again to FIGS. 5A and 5B, an interlayer insulating film II2 made, for instance, of silicon oxide film, is formed over the interlayer insulating film II1 in such a manner as to cover the wiring M1. A patterned, second-layer wiring M2 is formed over the interlayer insulating film II2. The second-layer wiring M2 is electrically coupled to the first-layer wiring M1 through a contact CT filled into a through-hole in the interlayer insulating film II2.

An interlayer insulating film II3 is formed over the interlayer insulating film II2 in such a manner as to cover the wiring M2. A third-layer wiring M3 is formed over the interlayer insulating film II3. FIGS. 5A and 5B indicate that the wiring M3 is disposed to extend over the entire region. However, the wiring M3 may also be patterned in the same manner as the wirings M1, M2.

An interlayer insulating film II4 is formed over the interlayer insulating film II3 in such a manner as to cover the wiring M3. A passivation film PAF is formed over the interlayer insulating film II4. A condenser lens LNS is disposed over the passivation film PAF. The condenser lens LNS is used to focus light onto the photodiode PD. Thus, FIGS. 5A and 5B indicate that the condenser lens LNS is periodically disposed over the entire surface of the passivation film PAF. However, it is necessary that the condenser lens LNS be at least disposed directly above the photodiode PD.

The individual layers above the interlayer insulating film II1 are not shown in FIG. 3.

A method of forming the above-described pixel section, in particular, of the semiconductor device according to the present embodiment will now be described with reference to FIGS. 6 to 15A and 15B.

Figure 6A:
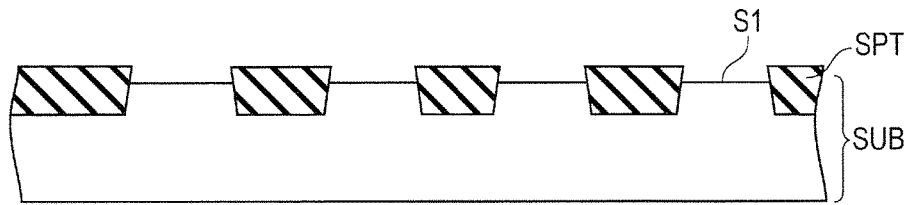
FIG. 6A is a schematic cross-sectional view illustrating a first process of a semiconductor device manufacturing method according to the first embodiment in the portion taken along line VA-VA of FIG. 3.
Figure 6B:
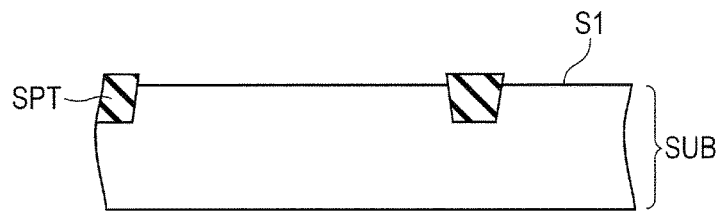
FIG. 6B is a schematic cross-sectional view illustrating the first process of the semiconductor device manufacturing method according to the first embodiment in the portion taken along line VB-VB of FIG. 3.

Referring to FIGS. 6A and 6B, first of all, the semiconductor substrate SUB made of a semiconductor material is prepared. The semiconductor material to be selected, such as silicon or germanium, varies with the wavelength of light incident on the semiconductor substrate SUB during use. Next, the separating insulating film SPT is formed over one surface of the semiconductor substrate SUB, for example, over the upper main surface S1 of the semiconductor substrate SUB. The separating insulating film SPT is used to separate the main surface S1 into a region where the transfer transistor TX is formed, a region where the amplifying transistor AMI is formed, a region where the reset transistor RST is formed, and a region where the selection transistor SEL is formed. The separating insulating film SPT electrically separates the above-mentioned regions from each other.

Figure 7A:
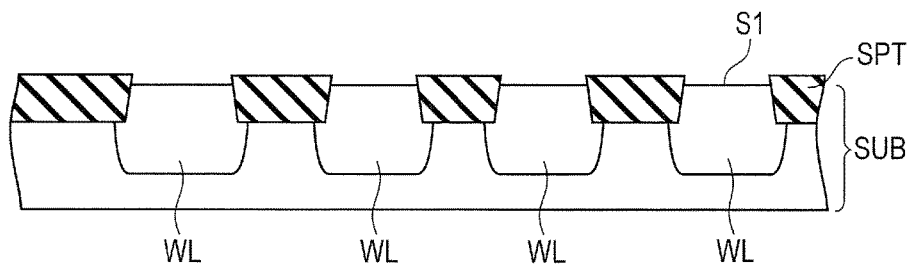
FIG. 7A is a schematic cross-sectional view illustrating a second process of the semiconductor device manufacturing method according to the first embodiment in the portion taken along line VA-VA of FIG. 3.
Figure 7B:
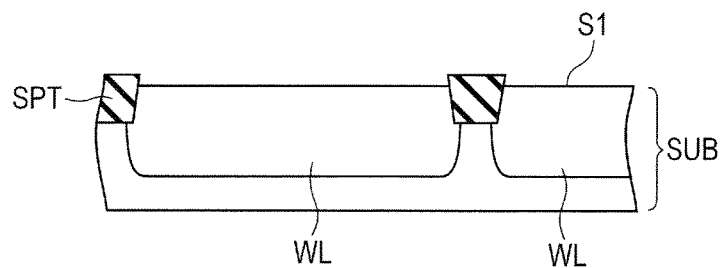
FIG. 7B is a schematic cross-sectional view illustrating the second process of the semiconductor device manufacturing method according to the first embodiment in the portion taken along line VB-VB of FIG. 3.

Referring to FIGS. 7A and 7B, the well region WL is formed over the main surface S1 of the semiconductor substrate SUB by using common photoengraving and ion implantation techniques. The well region WL includes conductive impurities for forming, for example, the active region AR, the floating diffusion region FD, and the reset active region Ra.

Figure 8A:
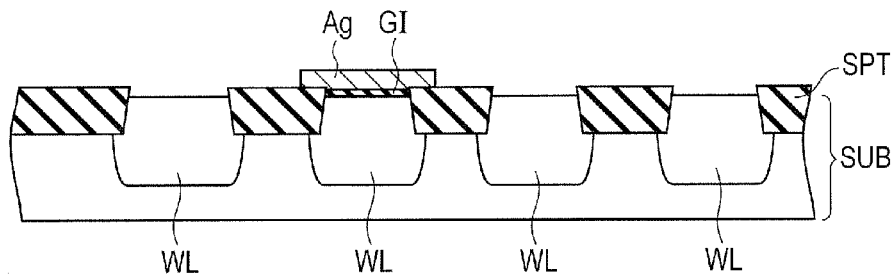
FIG. 8A is a schematic cross-sectional view illustrating a third process of the semiconductor device manufacturing method according to the first embodiment in the portion taken along line VA-VA of FIG. 3.
Figure 8B:
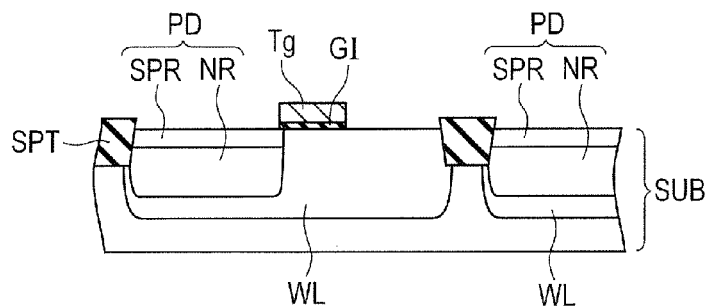
FIG. 8B is a schematic cross-sectional view illustrating the third process of the semiconductor device manufacturing method according to the first embodiment in the portion taken along line VB-VB of FIG. 3.

Referring to FIGS. 8A and 8B, the gate insulating film GI and the amplifying gate electrode Ag are formed at a desired location in a region where the amplifying transistor AMI is formed, and the gate insulating film GI and the transfer gate electrode Tg are formed at a desired location in a region where the transfer transistor TX is formed. More specifically, the gate insulating film is formed over the main surface of the semiconductor substrate SUB by, for example, a thermal oxidation method. For example, a polycrystalline silicon film that is to act as a gate electrode is laid over the gate insulating film. Subsequently, the gate insulating film, the polycrystalline silicon film, and the like are patterned to form the gate insulating film GI and the gate electrode GE as indicated in the figures. Although not shown in the figures, the same holds true for a region where, for example, the reset gate electrode Rg or the selection gate electrode Sg is formed.

Further, the n-type region NR and the surface p-type region SPR are formed by using common photoengraving and ion implantation techniques to implant conductive impurities into the well region WL in a region where the transfer transistor TX is formed. This results in the formation of the photodiode PD that includes the surface p-type region SPR and the n-type region NR.

Figure 9A:
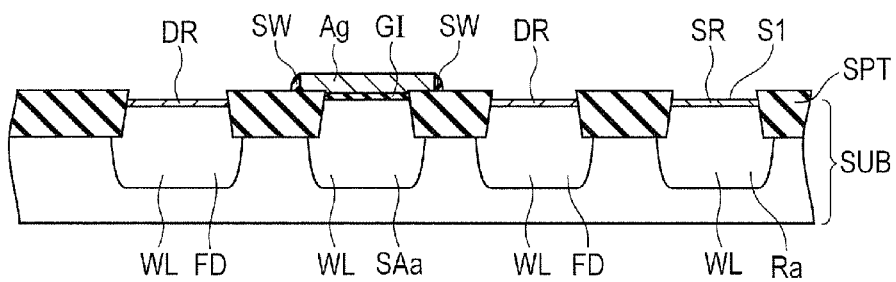
FIG. 9A is a schematic cross-sectional view illustrating a fourth process of the semiconductor device manufacturing method according to the first embodiment in the portion taken along line VA-VA of FIG. 3.
Figure 9B:
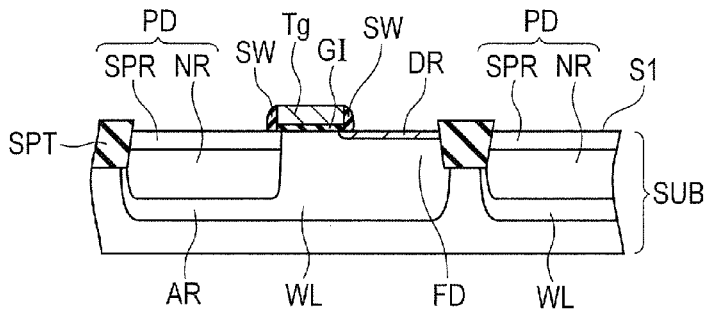
FIG. 9B is a schematic cross-sectional view illustrating the fourth process of the semiconductor device manufacturing method according to the first embodiment in the portion taken along line VB-VB of FIG. 3.

Referring to FIGS. 9A and 9B, the source region SR and drain region DR of each transistor are formed over the main surface S1 of the semiconductor substrate SUB within each well region WL by using common photoengraving and ion implantation techniques. The drain region DR to be formed in a region where the transfer transistor TX is formed, in particular, is formed as the floating diffusion region FD of the photodiode PD.

Subsequently, for example, a silicon oxide film and a silicon nitride film are sequentially laid over the whole of the main surface S1 of the semiconductor substrate SUB. The sidewall insulating film SW made of silicon oxide film and silicon nitride film is formed over the sidewalls, for instance, of the transfer gate electrode Tg and amplifying gate electrode Ag as a residue of antireflection film by using common photoengraving and etching techniques.

Consequently, as shown, for instance, in FIG. 9B, a plurality of transfer transistors TX are formed over the main surface S1 in a matrix format so as to include the photodiode PD and floating diffusion region FD formed in the semiconductor substrate SUB (see FIG. 3). Further, as shown, for instance, in FIG. 9A, a plurality of the other transistors AMI, RST, SEL are formed over the main surface S1 of the semiconductor substrate S1 in a matrix format so as to include at least one signal input/output section, namely, the source region SR, the drain region DR, and/or the gate electrode (for example, the amplifying gate electrode Ag) (see FIG. 3).

The various transistors are completed as described above. Thus, the well region WL formed over the main surface S1 of the semiconductor substrate SUB now includes, for example, the floating diffusion region FD, the active region SAa, or the reset active region Ra depending on the type of transistor to which the well region WL belongs.

Figure 10A:
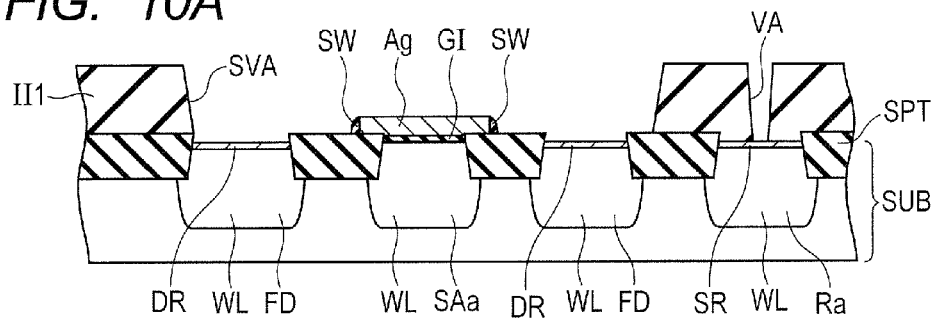
FIG. 10A is a schematic cross-sectional view illustrating a fifth process of the semiconductor device manufacturing method according to the first embodiment in the portion taken along line VA-VA of FIG. 3.
Figure 10B:
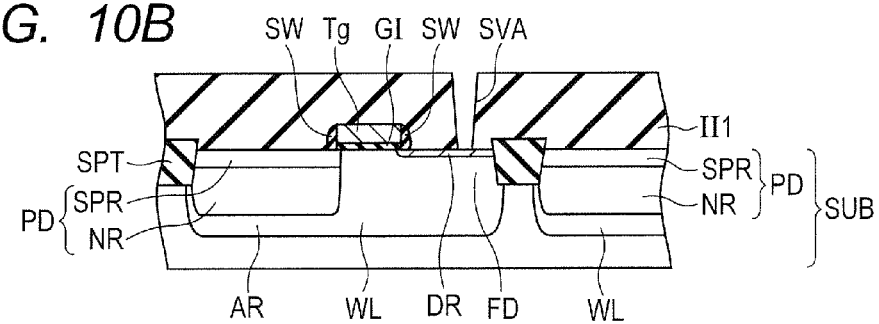
FIG. 10B is a schematic cross-sectional view illustrating the fifth process of the semiconductor device manufacturing method according to the first embodiment in the portion taken along line VB-VB of FIG. 3.

Referring to FIGS. 10A and 10B, the interlayer insulating film II1 made of silicon oxide film is formed so as to cover the transfer transistors TX and the other transistors (for example, the amplifying transistor AMI and the reset transistor RST) by using, for example, a chemical vapor deposition (CVD) method. Subsequently, the upper surface of the interlayer insulating film II1 is polished flat by a so-called chemical mechanical polishing (CMP) method.

Further, common photoengraving and etching techniques are used to form a groove called a via VA from one polished main surface of the interlayer insulating film II1 to, for example, the drain region DR of the transfer transistor TX and the source region SR of the reset transistor, which correspond to the opposing other main surface. Further, a groove called a shared via SVA, which has a larger area than the above-mentioned via VA when viewed from above, is formed so as to reach the upper surfaces of a total of three regions, for example, the drain region DR of one of the arrayed transfer transistors TX, the drain region DR of a neighboring other transfer transistor TX, and the amplifying gate electrode Ag of the amplifying transistor AMI between the above-mentioned two transfer transistors TX. The shared via SVA is formed by using a so-called drying etching technique.

The via VA and the shared via SVA may be substantially shaped like a square when viewed from above. Alternatively, however, they may be circular in shape. The via VA and the shared via SVA are formed inclined relative to a direction perpendicular to one (upper) main surface of the interlayer insulating film II1, which is oriented from the one (upper) main surface of the interlayer insulating film II1 to the other (lower) main surface. As a result, the via VA and the shared via SVA have such a cross-section that the width in the direction along the main surface decreases from the one (upper) main surface of the interlayer insulating film II1 to the other (lower) main surface (that is, have a cross-section that gradually decreases in width from the upper to the lower main surface).

Figure 11A:
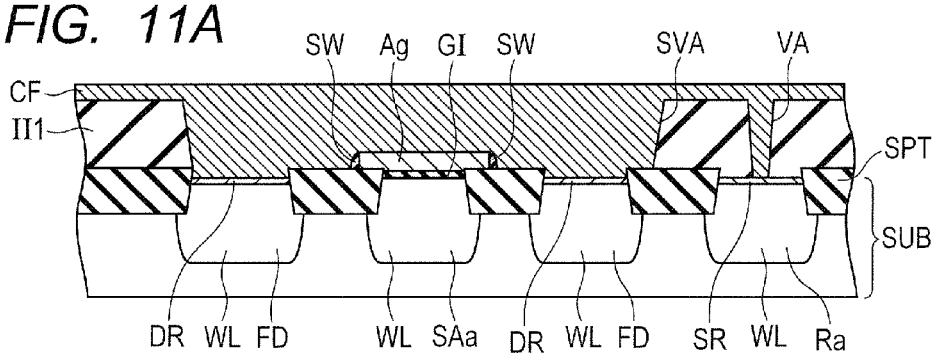
FIG. 11A is a schematic cross-sectional view illustrating a sixth process of the semiconductor device manufacturing method according to the first embodiment in the portion taken along line VA-VA of FIG. 3.
Figure 11B:
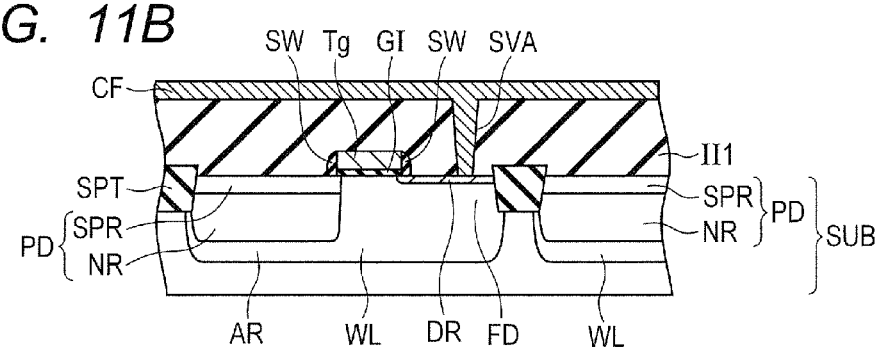
FIG. 11B is a schematic cross-sectional view illustrating the sixth process of the semiconductor device manufacturing method according to the first embodiment in the portion taken along line VB-VB of FIG. 3.

Referring to FIGS. 11A and 11B, a conductive film CF made, for instance, of tungsten or copper is filled into the via VA and the shared via SVA. For this process, for example, the CVD method is used to form a thin tungsten film over the interlayer insulating film II1 as well.

Figure 12A:
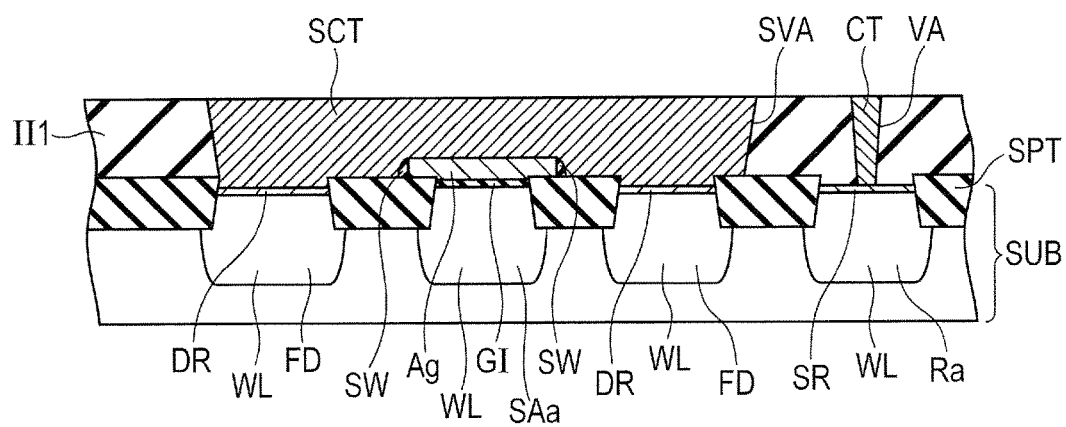
FIG. 12A is a schematic cross-sectional view illustrating a seventh process of the semiconductor device manufacturing method according to the first embodiment in the portion taken along line VA-VA of FIG. 3.
Figure 12B:
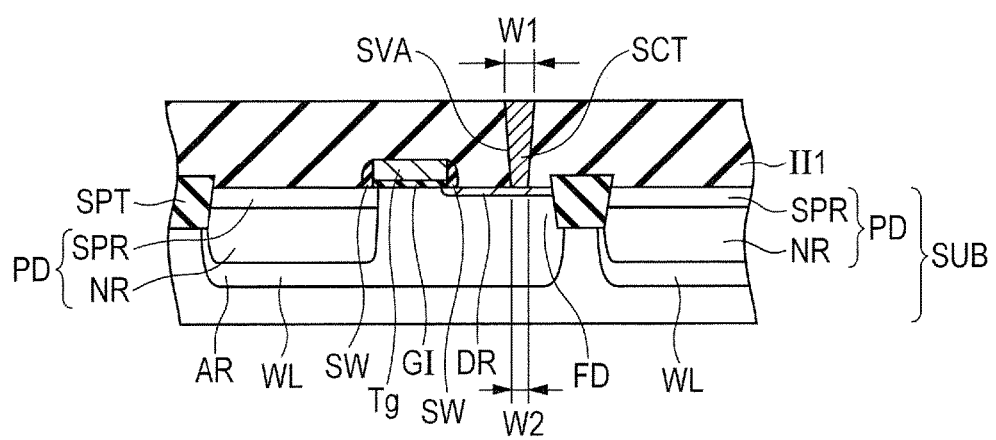
FIG. 12B is a schematic cross-sectional view illustrating the seventh process of the semiconductor device manufacturing method according to the first embodiment in the portion taken along line VB-VB of FIG. 3.

Referring to FIGS. 12A and 12B, the thin tungsten film over the interlayer insulating film II1 is removed by the CMP method. This forms a contact CT in the via VA and a shared contact SCT in the shared via SVA. The contact CT and the shared contact SCT function as a coupling layer that electrically couples the various transistors formed over the semiconductor substrate SUB to the upper layer.

As described above, the via VA and the shared via SVA are extended in an inclined manner in a direction perpendicular to the main surface of the interlayer insulating film II1, and shaped so that they gradually become thin toward the bottom of the figures. Therefore, the contact CT and the shared contact SCT, which are formed when the insides of the via VA and shared via SVA are filled, are similarly formed so that their sidewalls (the surfaces in contact with the contact CT and the shared contact SCT) are extended in an inclined manner in a direction perpendicular to the main surface of the interlayer insulating film II1.

The shared contact SCT is formed so as to reach the upper surfaces of a total of three regions, for example, the drain region DR (signal output section) of one of the arrayed transfer transistors TX, the drain region DR (signal output section) of a neighboring other transfer transistor TX, and the amplifying gate electrode Ag (signal input/output section) of the amplifying transistor AMI between the above-mentioned two transfer transistors TX. In other words, the signal output sections are the floating diffusion regions FD (electric charge storage capacity region) respectively included, for example, in two neighboring transfer transistors TX, and the signal input/output section is the amplifying gate electrode Ag of the amplifying transistor AMI, which is another transistor formed between the above-mentioned two floating diffusion regions FD.

As an example, the maximum width (the width W1 in left-right direction of the uppermost section of FIG. 12B) of a short side cross-section of the shared contact SCT, which is shown in FIG. 12B, is, for example, approximately 0.2 μm, and the depth of the shared contact SCT (the depth in up-down direction of FIG. 12B) is approximately 1 μm. Thus, the aspect ratio of the shared contact SCT is approximately 5. The minimum width of the cross-section of the shared contact SCT (the width W2 in left-right direction of the lowermost section of FIG. 12B) is, for example, approximately 0.17 μm.

When a conductive film CF having a thickness, for example, approximately ⅔ the above-mentioned short side width W1 (W2) can be supplied to sidewalls in the shared via SVA, the conductive film CF subsequently spreads toward the center from the left and right sidewalls shown in FIG. 12B. Therefore, even if the long side dimension of the cross-section of the shared contact SCT shown in left-right direction of FIG. 12A is extremely great, the shared contact SCT can be formed by completely filling the conductive film CF into the shared via SVA.

Figure 13A:
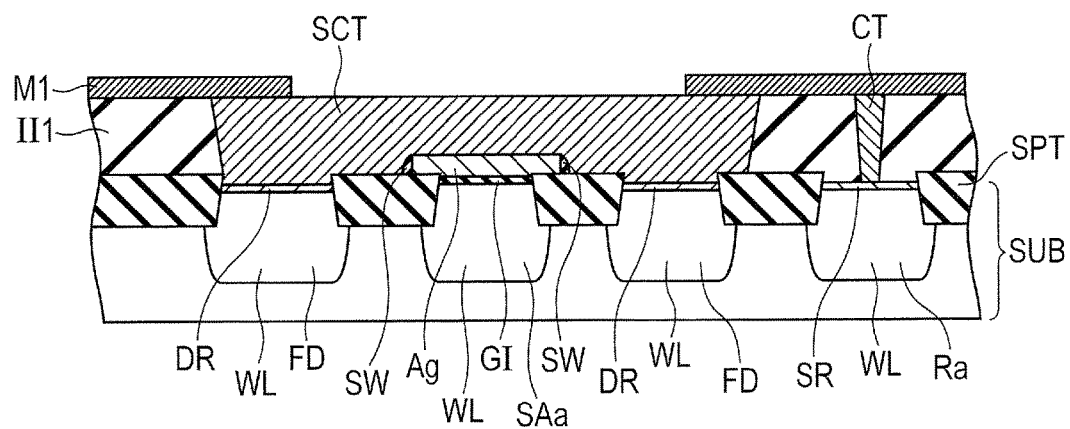
FIG. 13A is a schematic cross-sectional view illustrating an eighth process of the semiconductor device manufacturing method according to the first embodiment in the portion taken along line VA-VA of FIG. 3.
Figure 13B:
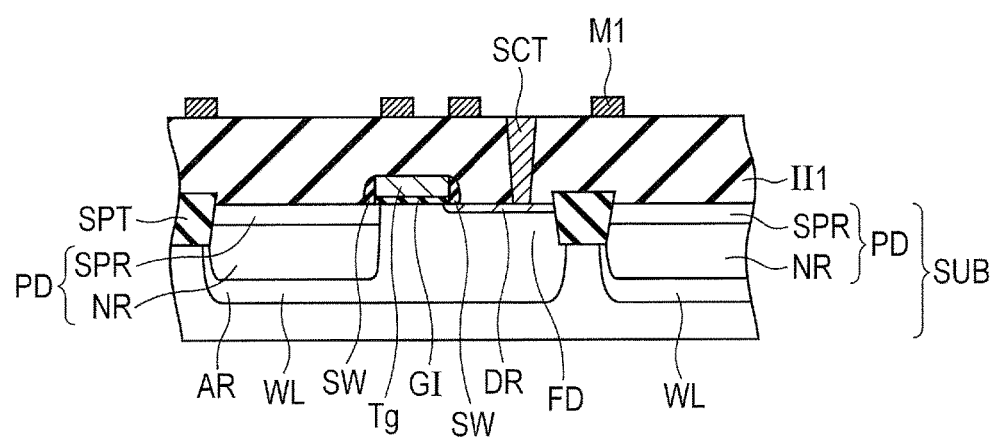
FIG. 13B is a schematic cross-sectional view illustrating the eighth process of the semiconductor device manufacturing method according to the first embodiment in the portion taken along line VB-VB of FIG. 3.

Referring to FIGS. 13A and 13B, a thin film made, for instance, of aluminum is formed over the interlayer insulating film II1 by, for example, a sputtering method. Then, the wiring M1 made, for instance, of aluminum is formed by using common photoengraving and etching techniques. In a region shown, for instance, in FIG. 13A, the wiring M1 is formed so as to cover the upper surface of the contact CT and has an opening above the upper surface of the shared contact SCT.

Figure 14A:
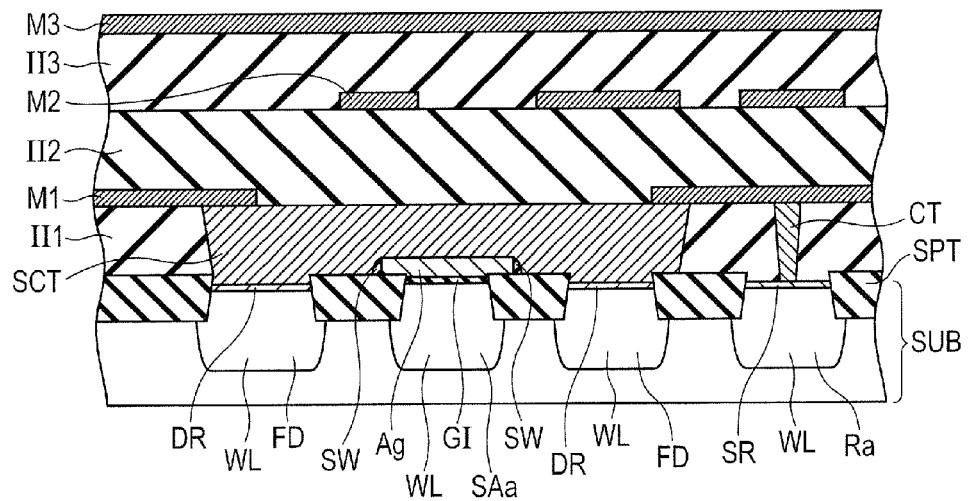
FIG. 14A is a schematic cross-sectional view illustrating a ninth process of the semiconductor device manufacturing method according to the first embodiment in the portion taken along line VA-VA of FIG. 3.
Figure 14B:
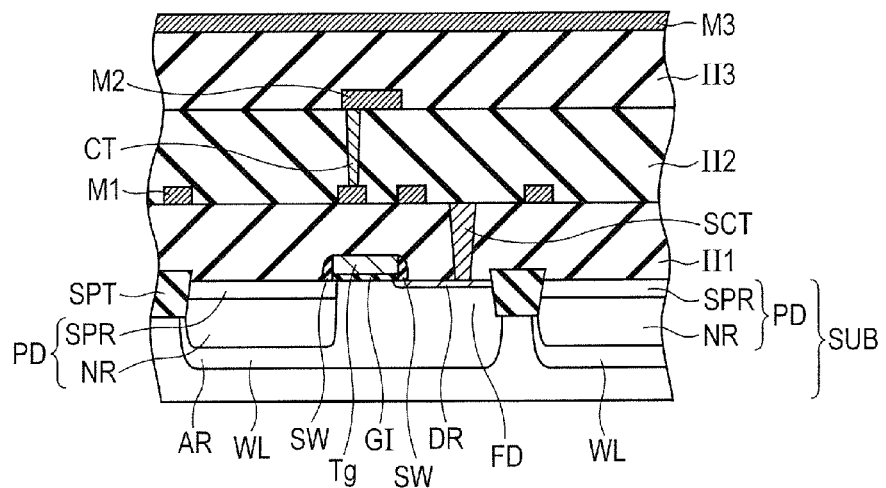
FIG. 14B is a schematic cross-sectional view illustrating the ninth process of the semiconductor device manufacturing method according to the first embodiment in the portion taken along line VB-VB of FIG. 3.

Referring to FIGS. 14A and 14B, the interlayer insulating film II2 is formed over the interlayer insulating film II1 and the wiring M1. After the upper surface of the interlayer insulating film II2 is polished flat by the CMP method, a through-hole is formed in a desired region (in the wiring M1). The interlayer insulating film II2 and the through-hole are formed in the same manner as the aforementioned interlayer insulating film II1 and the via VA (shared via SVA). As the interlayer insulating film II1 and the wiring M1 differ in etching selection ratio, the etching of the interlayer insulating film II1, which is performed from the upper side to the lower side, can easily be finished when the wiring M1 is reached.

A conductive layer made, for instance, of tungsten is filled into the above-mentioned through-hole to form the contact CT. A pattern of the wiring M2 that is made, for instance, of aluminum is then formed over the interlayer insulating film II2 (formed particularly over the contact CT in the interlayer insulating film II2). The wiring M2 is formed in the same manner as the wiring M1. Further, in the same manner as described earlier, the interlayer insulating film II3 is formed over the interlayer insulating film II2 and the wiring M2. After the upper surface of the interlayer insulating film II3 is polished flat by the CMP method, the contact CT is formed in the interlayer insulating film II3 as well although it is not shown in the figures. A pattern of the wiring M3 that is made, for instance, of aluminum is formed over the interlayer insulating film II3 in the same manner as described above.

Figure 15A:
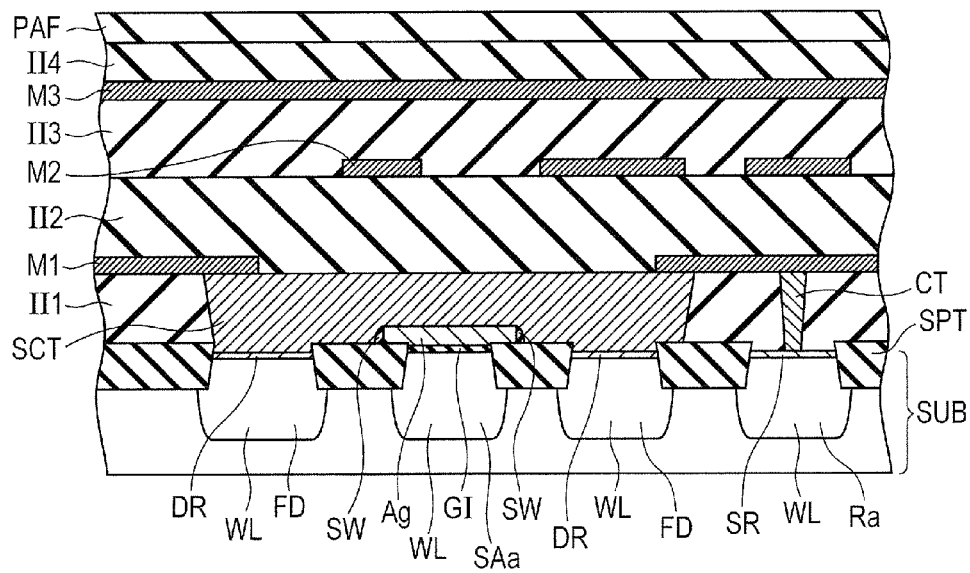
FIG. 15A is a schematic cross-sectional view illustrating a tenth process of the semiconductor device manufacturing method according to the first embodiment in the portion taken along line VA-VA of FIG. 3.
Figure 15B:
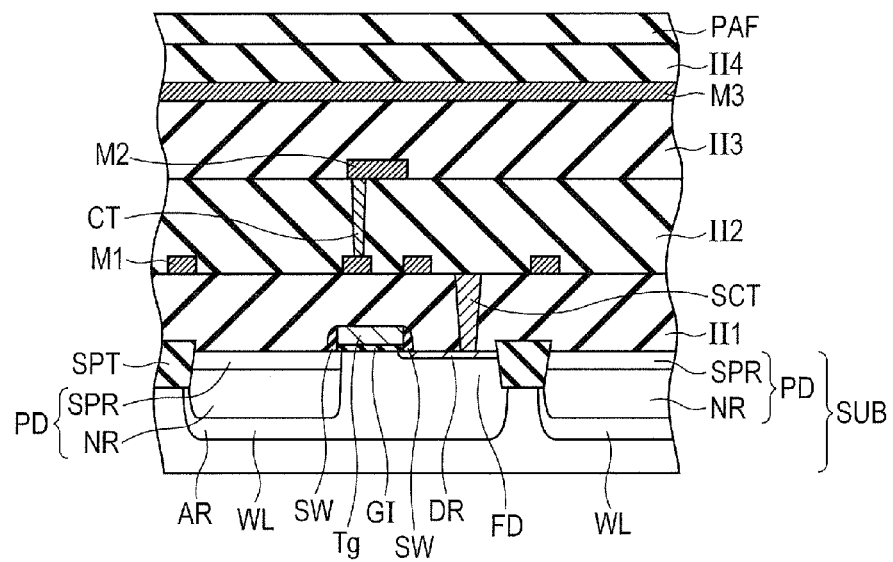
FIG. 15B is a schematic cross-sectional view illustrating the tenth process of the semiconductor device manufacturing method according to the first embodiment in the portion taken along line VB-VB of FIG. 3.

Referring to FIGS. 15A and 15B, the interlayer insulating film II4 is formed over the interlayer insulating film II3 so as to cover the wiring M3. The upper surface of the interlayer insulating film II4 is flattened, for instance, by the CMP method. Subsequently, a silicon nitride film is laid over the interlayer insulating film II4, for instance, by the CVD method. This silicon nitride film serves as a passivation film PAF.

Referring to FIGS. 5A and 5B, the condenser lens LNS is finally disposed directly above particularly the photodiode PD. A plurality of image sensors is now formed as a semiconductor device having the pixel section shown in FIG. 3.

Operational advantages of the present embodiment will now be described with reference to a comparative example shown in FIGS. 16, 17A, and 17B.

Figure 16:
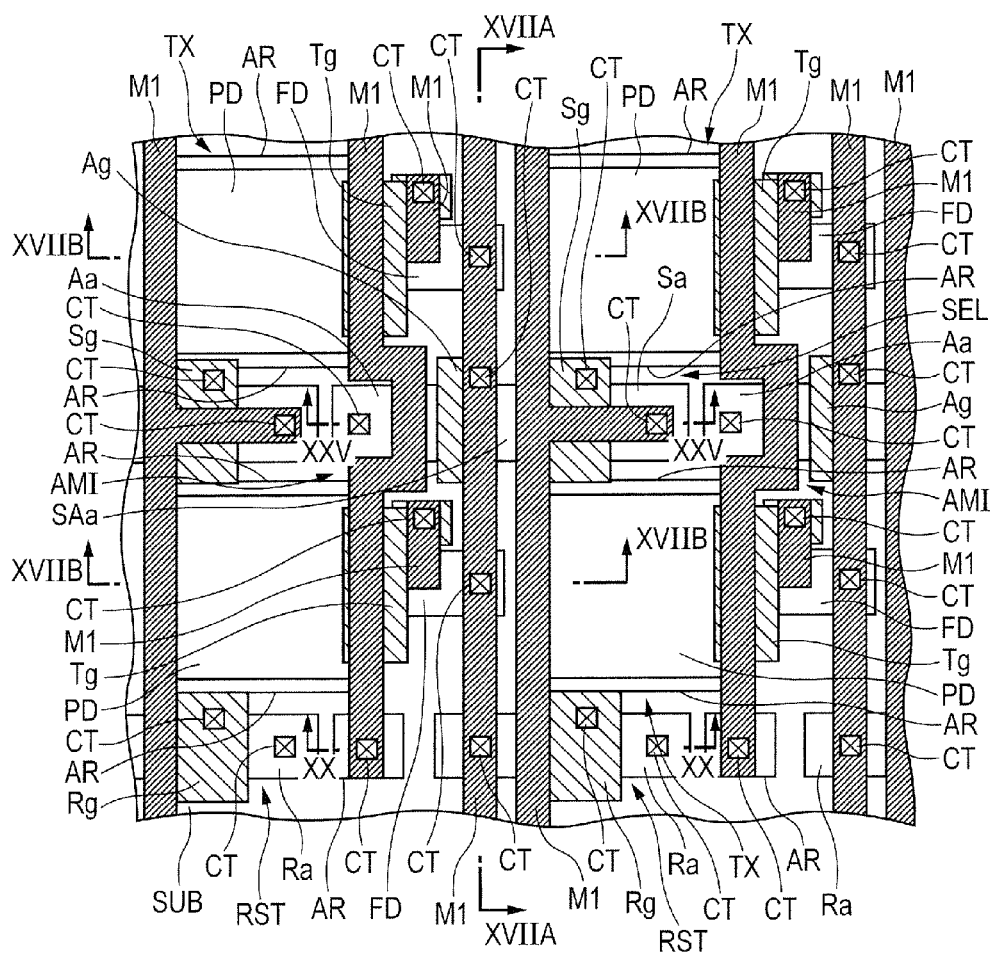
FIG. 16 is a schematic plan view illustrating a configuration of a pixel section of a comparative example.
Figure 17A:
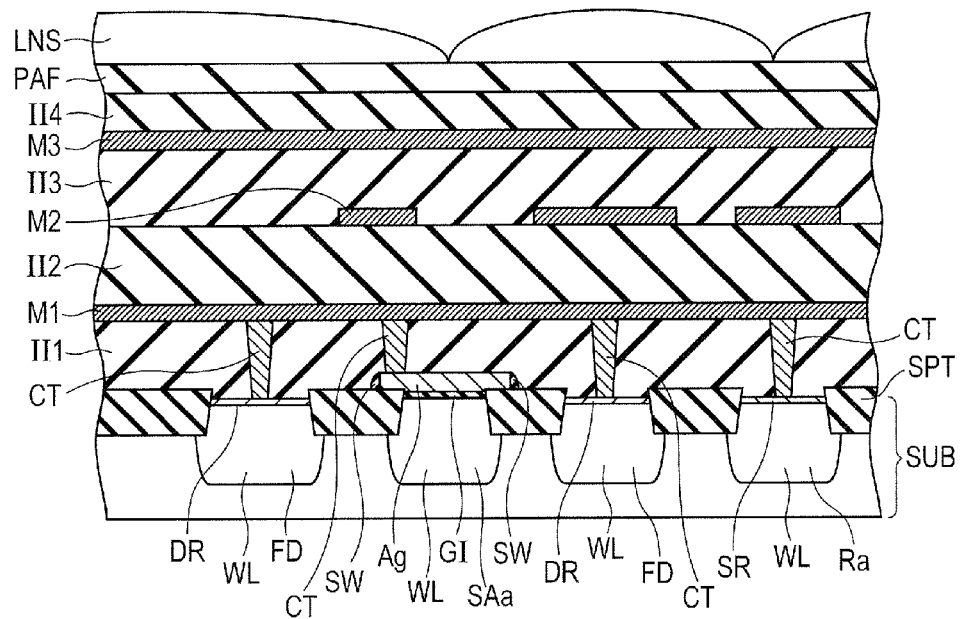
FIG. 17A is a schematic cross-sectional view of a portion taken along line XVIIA-XVIIA of FIG. 16.
Figure 17B:
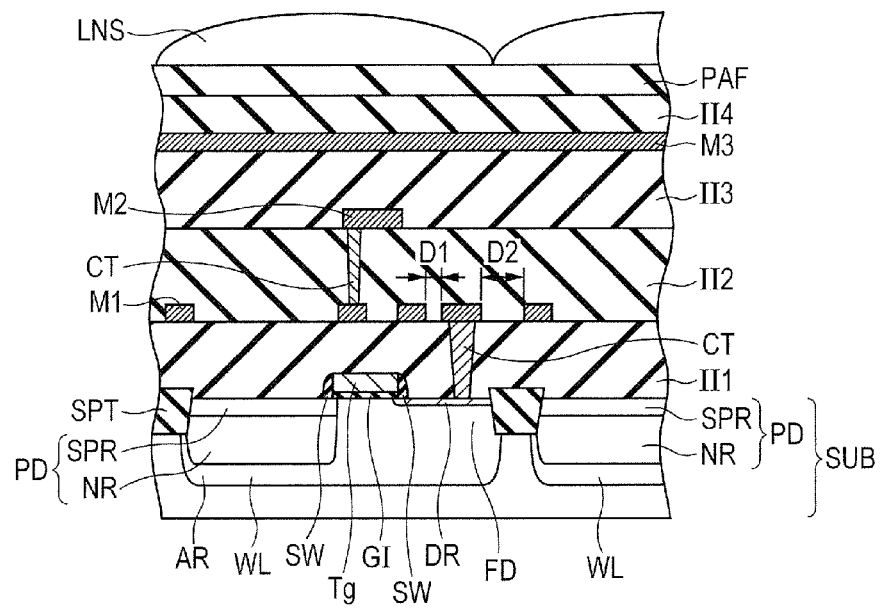
FIG. 17B is a schematic cross-sectional view of a portion taken along line XVIIB-XVIIB of FIG. 16.

Referring to FIGS. 16, 17A, and 17B, when viewed from above, a pixel section of the comparative example is configured so that four transfer transistors TX, one amplifying transistor AMI, one reset transistor RST, and one selection transistor SEL are disposed in the same manner as shown in FIG. 3. Consequently, referring to FIG. 16, the region FD of the upper left (upper right) one of the four arrayed transfer transistors TX, the amplifying gate electrode Ag, the region FD of the lower left (lower right) one of the four arrayed transfer transistors TX, and a portion of the reset active region Ra are collinearly arranged in up-down direction of the figure.

In the comparative example, however, contacts CT are individually extended upward from the surfaces of the above-mentioned terminals. These contacts CT are electrically coupled to the wiring M1 that is extended above (in a layer above) the contacts CT for a long distance in up-down direction of the figure. In other words, the wiring M1 is electrically coupled to the above-mentioned regions, such as the regions FD, by the contacts CT that are extended downward from the wiring M1 through the interlayer insulating film II1 until they reach the above-mentioned region FD and the amplifying gate electrode Ag and the other region FD and the reset active region Ra. Referring to FIG. 16, when viewed from above, the region FD of the upper right one of the four arrayed transfer transistors TX, the amplifying gate electrode Ag, the region FD of the lower right one of the four arrayed transfer transistors TX, and a portion of the reset active region Ra are electrically coupled to the upper wiring M1 by the contacts CT in the same manner as described above.

As indicated in FIG. 16, a cross-section in left-right direction that includes the upper left transfer transistor TX shown in FIG. 16 is similar to a cross-section in left-right direction that includes the lower left transfer transistor TX shown in FIG. 16.

In the above instance, the number of wirings M1 tends to increase as shown in FIG. 17B. Thus, when the photodiode PD and the like are progressively miniaturized, the distance D1, D2 between a pair of neighboring wirings M1 as viewed in left-right direction of the figure becomes shorter. Inter-wiring capacitance is unintentionally formed by the pair of wirings M1 and the interlayer insulating film II2 interposed therebetween. The magnitude of the inter-wiring capacitance increases with a decrease in the distance D1, D2.

An electric signal output from the photodiode PD may significantly vary with the magnitude of inter-wiring capacitance generated around the photodiode PD. If, for instance, the inter-wiring capacitance increases, the output of an electric signal from the photodiode PD may decrease in magnitude to reduce the overall functionality of the image sensors.

Further, if the above-mentioned distance D1, D2 shortens, a pair of neighboring wirings M1 disposed at the distance D1, D2 are more likely to be short-circuited due, for instance, to foreign matter deposited on the surface of the semiconductor device. Thus, the semiconductor device may become defective, thereby decreasing the yield of the image sensors.

As such being the case, the present embodiment is configured so that a total of at least three of the regions and gates of the transistors formed over the semiconductor substrate SUB, including the floating diffusion region FD of at least one of the transfer transistors TX formed over the semiconductor substrate SUB and at least one of the signal input/output sections of another transistor, such as the amplifying gate electrode Ag of the amplifying transistor AMI, are electrically coupled to each other by the shared contact SCT, which serves as a coupling layer. More specifically, as shown in FIGS. 3 and 5B, for example, the upper left region FD, amplifying gate electrode Ag, and lower left region FD in FIG. 3 are electrically coupled to each other by the shared contact SCT, which serves as a coupling layer. In other words, a total of three elements, namely, two floating diffusion regions FD and one amplifying gate electrode Ag, are electrically coupled to each other by the shared contact SCT. The shared contact SCT is formed in a region that corresponds to the same layer as in the interlayer insulating film II1, which is disposed between the same layer as the wiring M1 and the main surface of the semiconductor substrate SUB.

Basically (except for the end of the shared contact SCT), the wiring M1 need not be formed directly above a region where the shared contact SCT is formed. With respect to a direction in which the shared contact SCT is extended as viewed from above, the wiring M1 is extended toward the outer side of the shared contact SCT from one and the other ends of the shared contact SCT (extended in accordance with an extension of the shared contact SCT).

Consequently, in a region containing a region where the shared contact SCT is disposed, the number of wirings M1 is smaller by one than in the comparative example. Therefore, the distance D3 between a pair of neighboring wirings M1 shown in FIG. 5B can be longer than the distances D1, D2 shown in FIG. 17B. Thus, in the present embodiment, the inter-wiring capacitance can be reduced to inhibit the wirings from being short-circuited. This makes it possible to improve the reliability of the semiconductor device and increase the degree of freedom in wiring layout. Further, the use of the above-described manufacturing method makes it possible to manufacture the semiconductor device whose reliability is improved in accordance with the present embodiment.

Meanwhile, the distance D3 between a pair of neighboring wirings M1 shown in FIG. 5B is considerably longer than the distances D1, D2. However, the shared contact SCT is disposed between this pair of wirings M1, and the distance D4 between the shared contact SCT and one of the pair of wirings M1 is shorter than the distance D3. However, as the width of the shared contact SCT is smaller than that of the wiring M1, the distance D4 is at least longer than the distance D2. Consequently, in the present embodiment, the distance between conductive layers, such as the wirings M1, can be certainly made longer than in the comparative example. This makes it possible to inhibit a short circuit from being formed between the shared contact SCT and the wiring M1.

Further, in the present embodiment, three or more signal input/output sections (terminals) are electrically coupled by one shared contact SCT so that the transfer transistor TX is electrically coupled to the other transistors such as the amplifying transistor AMI. Thus, layout efficiency achieved by allowing one shared contact SCT to couple the terminals can be made higher than in a case where, for example, two terminals are coupled by one shared contact SCT. Consequently, the configuration of the pixel section can be simplified. This makes it easy to manufacture the pixel section.

In the present embodiment, one shared contact SCT is brought into contact with (coupled to) the upper surfaces of two floating diffusion regions FD and the amplifying gate electrode Ag interposed therebetween. This structure can be manufactured by using the simplest layout when the shared contact SCT couples three or more terminals to form a node NOD (see FIG. 4).

Further, the sidewall of the shared contact SCT in the present embodiment is extended in a direction inclined from a direction perpendicular to the upper main surface of the interlayer insulating film II1 from its upper main surface to its lower main surface. As a result, the shared contact SCT is formed in such a manner that its width in a direction along the main surface decreases toward the underside of the shared contact SCT. When the shared contact SCT is formed as described above, the possibility of the semiconductor device malfunctioning can be made lower than when, for instance, the width of the shared contact SCT remains fixed between its upper end and its lower end (the shared contact SCT is cylindrical or prismatic in shape). This makes it possible to improve the reliability of the semiconductor device.

The shared contact SCT is formed in such a manner as to fill the conductive film CF into the shared via SVA that is formed by being extended in a direction inclined from a direction perpendicular to the upper main surface of the interlayer insulating film Il1 from its upper main surface to its lower main surface. Therefore, the conductive film CF can easily be filled into the shared via SVA.

Second Embodiment

Figure 18:
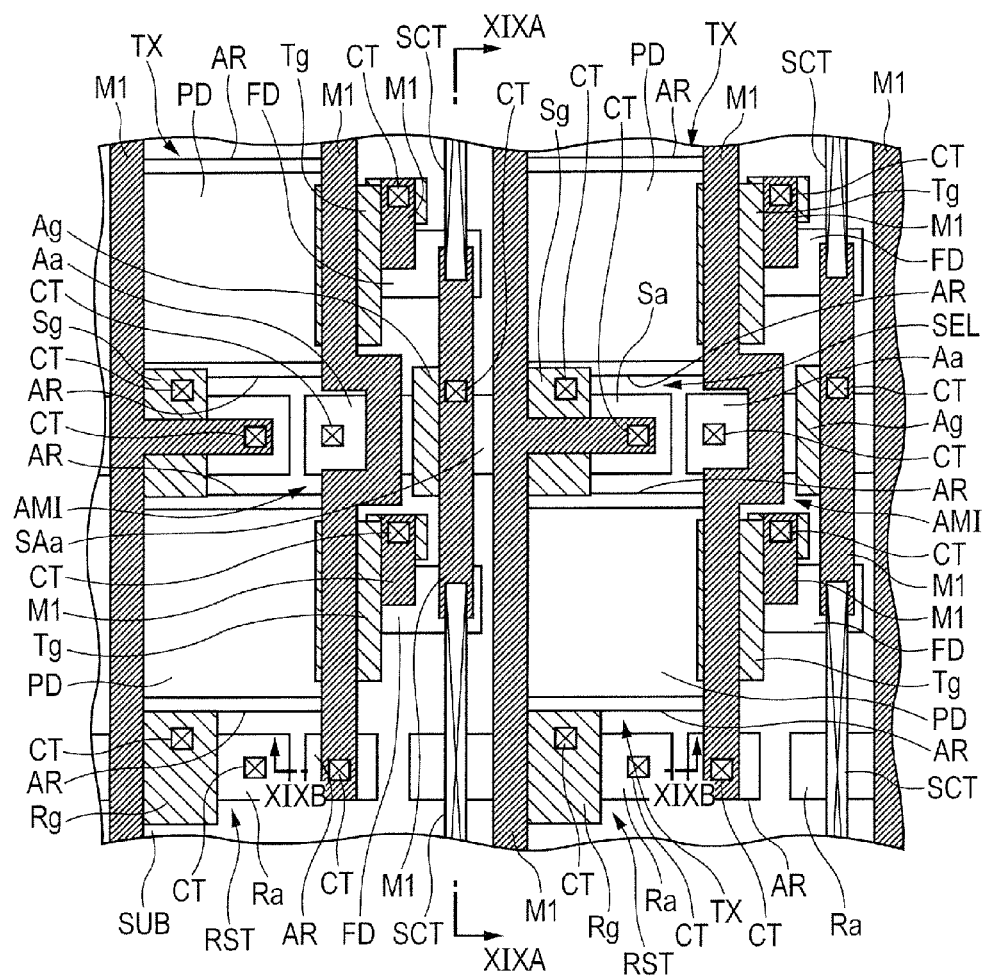
FIG. 18 is a schematic plan view illustrating a configuration of the pixel section according to a second embodiment of the present invention.
Figure 19A:
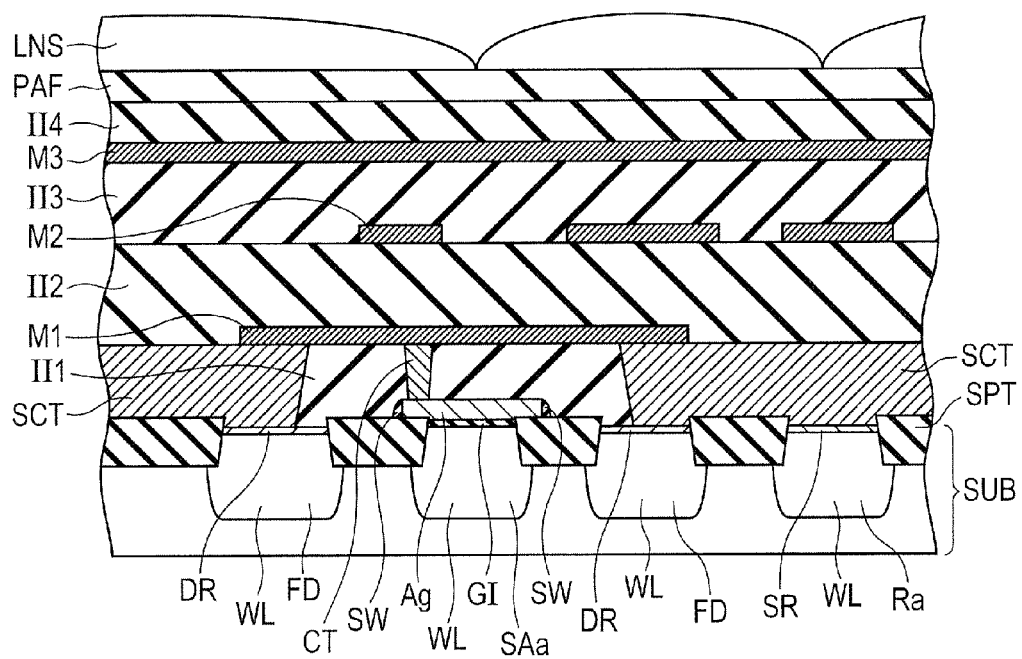
FIG. 19A is a schematic cross-sectional view of a portion taken along line XIXA-XIXA of FIG. 18.
Figure 19B:
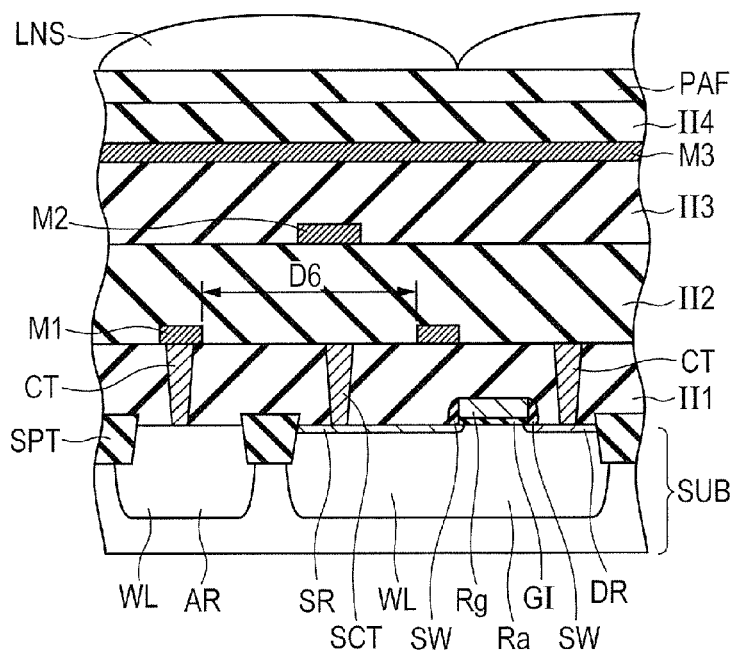
FIG. 19B is a schematic cross-sectional view of a portion taken along line XIXB-XIXB of FIG. 18.

Referring to FIGS. 18, 19A, and 19B, the semiconductor device according to a second embodiment of the present invention is similar to the semiconductor device according to the first embodiment in that four transfer transistors TX, one amplifying transistor AMI, one reset transistor RST, and one selection transistor SEL are included in the pixel section and disposed in the same manner as shown in FIG. 3 when viewed from above. Further, referring to FIG. 18, the region FD of the upper left (upper right) one of the four arrayed transfer transistors TX, the amplifying gate electrode Ag, the region FD of the lower left (lower right) one of the four arrayed transfer transistors TX, and a portion of the reset active region Ra are collinearly arranged in up-down direction of the figure. The upper left (upper right) region FD, the reset active region Ra, and the lower left (lower right) region FD are electrically coupled to each other by the shared contact SCT that serves as a coupling layer.

In FIGS. 18 and 19A, individual elements are repeatedly disposed so that the overall configuration is formed, for instance, in a matrix format, as is the case with FIGS. 3 and 5A. Thus, the uppermost section of the shared contact SCT shown in FIG. 18 is joined integrally to the lowermost section of the succeeding overlying shared contact SCT (not shown) configured as shown in FIG. 18. Therefore, three terminals (signal output and signal input/output sections), namely, the upper region FD shown in FIG. 18, the lower region FD (of a unit of the upper pixel section not shown), and the reset active region Ra interposed therebetween, are electrically coupled by one shared contact SCT.

Consequently, in the second embodiment, the shared contact SCT couples the upper surfaces of a total of three regions, namely, the drain regions DR (signal output sections) of two neighboring transfer transistors TX and the active region Ra (signal input/output section) of the reset transistor RST, which corresponds to another transistor disposed between the above-mentioned drain regions DR.

The other elements of the present embodiment are substantially the same as those of the first embodiment. Therefore, they are designated by the same reference numerals and will not be redundantly described.

Figure 20:
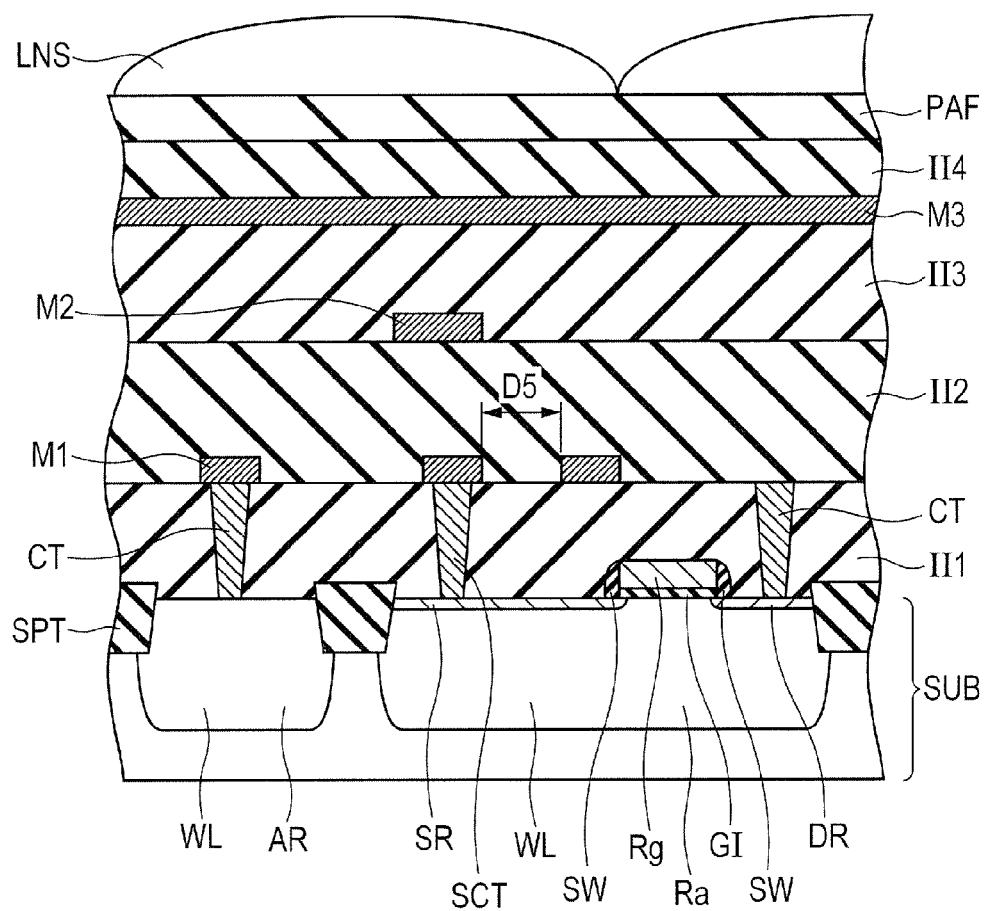
FIG. 20 is a schematic cross-sectional view of a portion taken along line XX-XX of FIG. 16.

Operational advantages of the present embodiment will now be described with reference to a comparative example shown in FIG. 20. Referring to FIG. 20, in the comparative example, the wiring M1, which is extended long in up-down direction of FIG. 16, is electrically coupled, for instance, to the reset transistor RST, which is disposed below the wiring M1, by individual contacts CT, which are extended from the wiring M1 to the underlying surfaces of terminals such as the region FD of the semiconductor device. In this instance, the distance D5 between a pair of neighboring wirings M1 in left-right direction of FIG. 20 may be reduced to increase the inter-wiring capacitance and short-circuit the pair of neighboring wirings M1.

As such being the case, when the shared contact SCT is used as described in conjunction with the present embodiment, the wiring M1 need not basically be formed directly above a region where the shared contact SCT is formed, as is the case with the first embodiment. In other words, the number of wirings M1 is smaller by one than in the comparative example. Therefore, the distance D6 (see FIG. 19B) between a pair of neighboring wirings in a region containing a region where the shared contact SCT is disposed can be made longer than the above-mentioned distance D5. Thus, in the present embodiment, the inter-wiring capacitance can be reduced to inhibit the wirings from being short-circuited. This makes it possible to improve the reliability of the semiconductor device and increase the degree of freedom in wiring layout. Further, the use of the above-described manufacturing method makes it possible to manufacture the semiconductor device whose reliability is improved in accordance with the present embodiment.

Third Embodiment

Figure 21:
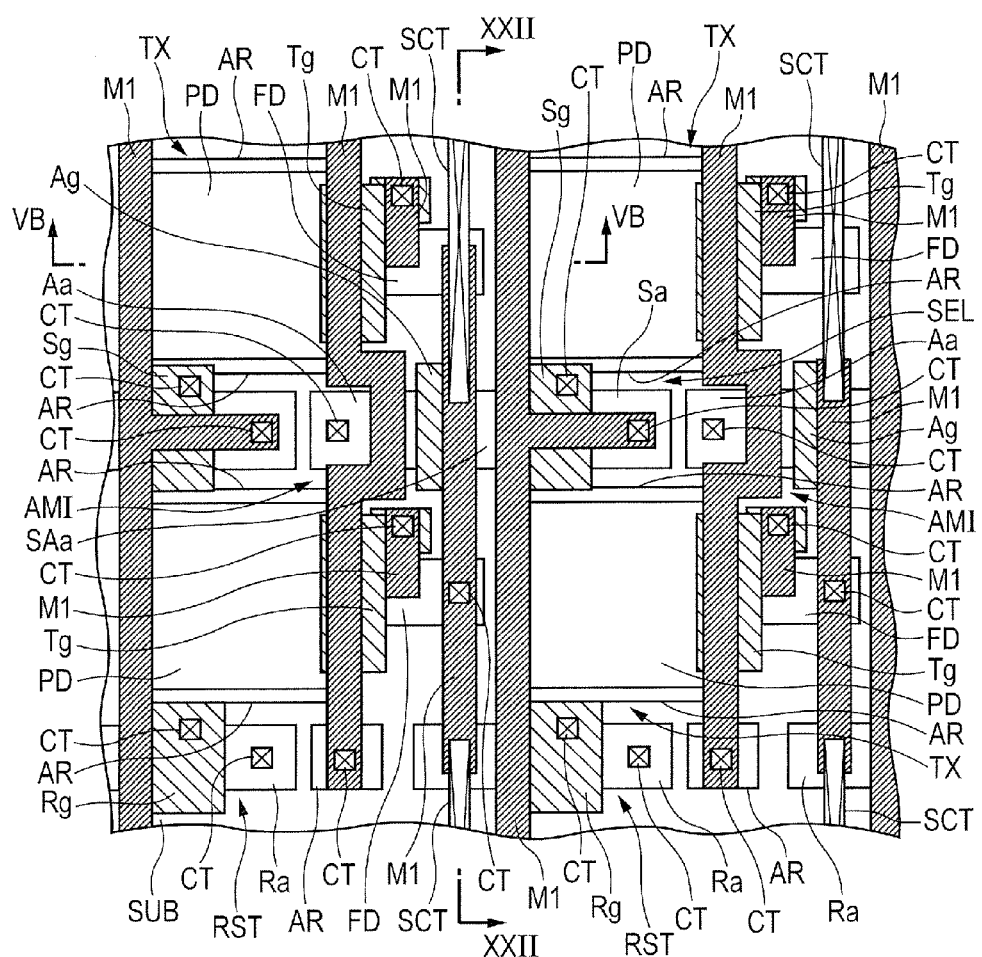
FIG. 21 is a schematic plan view illustrating a configuration of the pixel section according to a third embodiment of the present invention.
Figure 22:
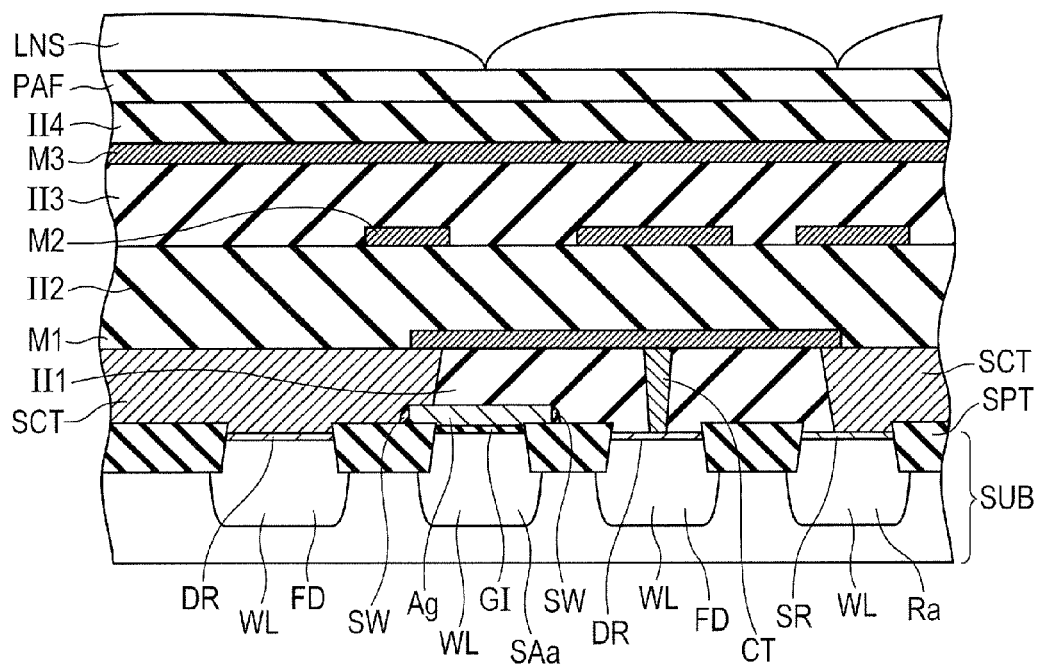
FIG. 22 is a schematic cross-sectional view of a portion taken along line XXII-XXII of FIG. 21.

Referring to FIGS. 21 and 22, the semiconductor device according to a third embodiment of the present invention is similar to the semiconductor device according to the first embodiment in that four transfer transistors TX, one amplifying transistor AMI, one reset transistor RST, and one selection transistor SEL are included in the pixel section and disposed in the same manner as shown in FIG. 3 when viewed from above. Further, referring to FIG. 21, the region FD of the upper left (upper right) one of the four arrayed transfer transistors TX, the amplifying gate electrode Ag, the region FD of the lower left (lower right) one of the four arrayed transfer transistors TX, and a portion of the reset active region Ra are collinearly arranged in up-down direction of the figure. The upper left (upper right) region FD, the amplifying gate electrode Ag, and a portion of the reset active region Ra are electrically coupled to each other by the shared contact SCT that serves as a coupling layer.

In FIGS. 21 and 22, individual elements are also repeatedly disposed so that the overall configuration is formed, for instance, in a matrix format, as is the case with FIGS. 3 and 5A. Thus, the uppermost section of the shared contact SCT shown in FIG. 21 is joined integrally to the lowermost section of the succeeding overlying shared contact SCT (not shown) configured as shown in FIG. 18. Therefore, three terminals (signal output and signal input/output sections), namely, the amplifying gate electrode Ag shown in FIG. 21, the upper region FD, and the reset active region Ra disposed below (a unit of the upper pixel section not shown), are electrically coupled by one shared contact SCT.

Consequently, in the third embodiment, the shared contact SCT couples the upper surfaces of a total of three regions, namely, the amplifying gate electrode Ag of the amplifying transistor AMI that corresponds to another transistor, the reset active region Ra (signal input/output section) of the reset transistor RST, and the drain region DR (signal input section) of a transfer transistor TX interposed therebetween.

The other elements of the present embodiment are substantially the same as those of the first embodiment. Therefore, they are designated by the same reference numerals and will not be redundantly described.

Operational advantages of the present embodiment will now be described. A cross-sectional view of a portion taken along line VB-VB that includes the upper left transfer transistor shown in FIG. 21 is in the same state as shown in FIG. 5B. The shared contact SCT exists in a portion along line VB-VB in FIG. 21, and the wiring M1 need not be disposed directly above the shared contact SCT. In other words, the number of wirings M1 is smaller by one than in the comparative example. Therefore, the distance D3 (see FIG. 5B) between a pair of neighboring wirings M1 in left-right direction of FIG. 21 can be made longer than the distances D1, D2 between a pair of neighboring wirings M1 in left-right direction in the comparative example, for instance, of FIG. 17B.

Consequently, in the present embodiment, too, the inter-wiring capacitance can be reduced to inhibit the wirings from being short-circuited, as is the case with the other embodiments. This makes it possible to improve the reliability of the semiconductor device and increase the degree of freedom in wiring layout. Further, the use of the above-described manufacturing method makes it possible to manufacture the semiconductor device whose reliability is improved in accordance with the present embodiment.

Fourth Embodiment

Figure 23:
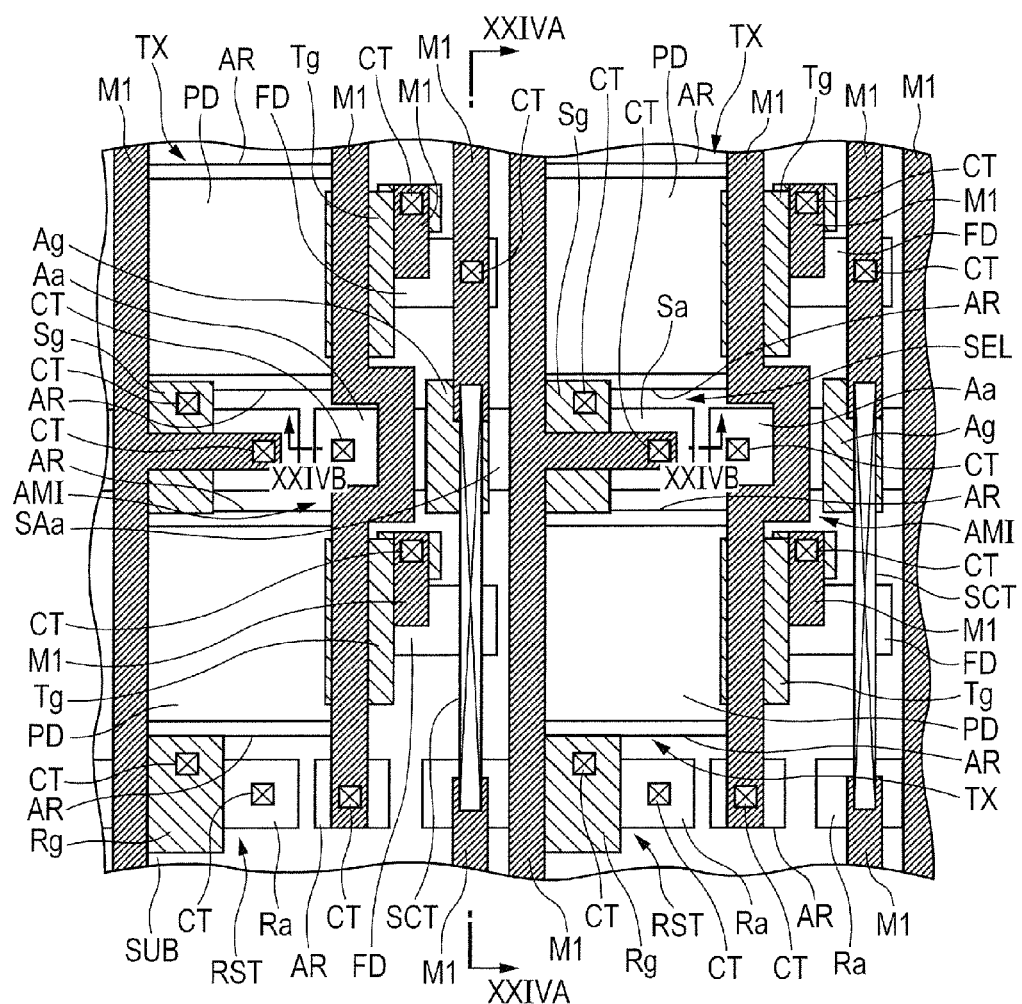
FIG. 23 is a schematic plan view illustrating a configuration of the pixel section according to a fourth embodiment of the present invention.
Figure 24A:
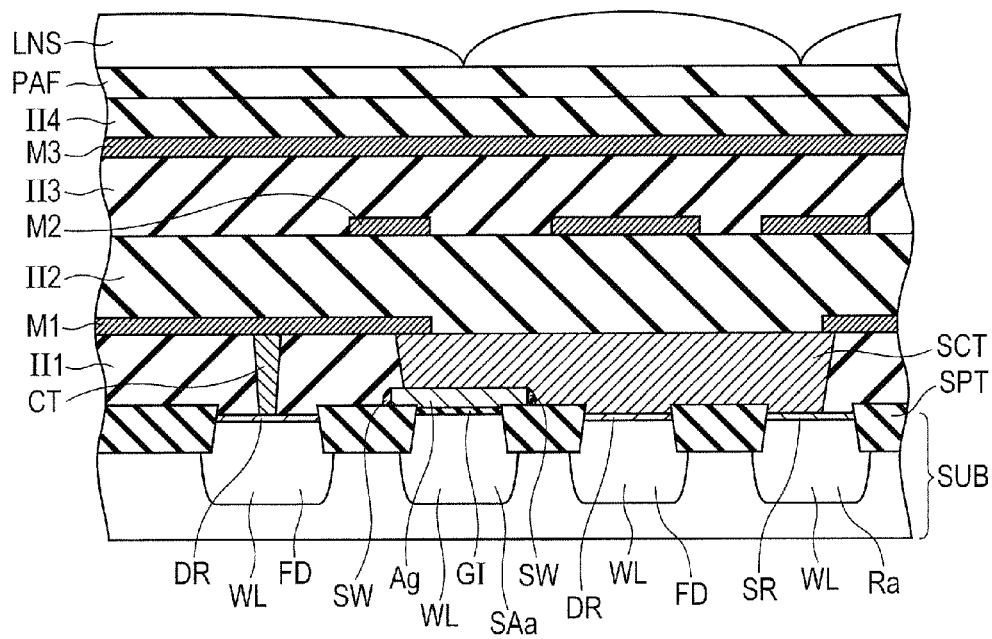
FIG. 24A is a schematic cross-sectional view of a portion taken along line XXIVA-XXIVA of FIG. 23.
Figure 24B:
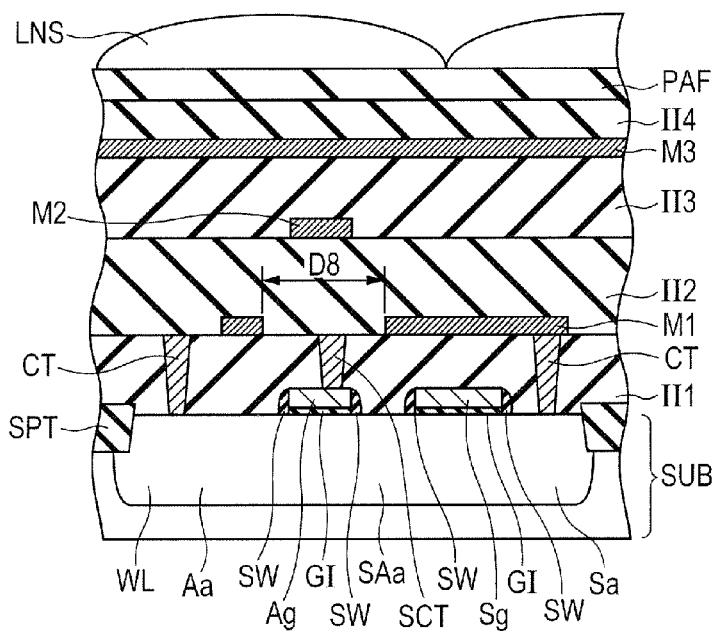
FIG. 24B is a schematic cross-sectional view of a portion taken along line XXIVB-XXIVB of FIG. 23.

Referring to FIGS. 23, 24A, and 24B, the semiconductor device according to a fourth embodiment of the present invention is similar to the semiconductor device according to the foregoing embodiments in the layout of various transistors in the pixel section.

In the fourth embodiment, referring to FIG. 23, the amplifying gate electrode Ag, a portion of the reset active region Ra, and the lower left one of the four arrayed regions FD that is interposed between the amplifying gate electrode Ag and the reset active region Ra are collinearly arranged in up-down direction of the figure. The amplifying gate electrode Ag, a portion of the reset active region Ra, and the lower left region FD interposed therebetween are electrically coupled to each other by the shared contact SCT that serves as a coupling layer.

Consequently, in the present embodiment, the shared contact SCT couples the upper surfaces of a total of three regions, namely, the amplifying gate electrode Ag of the amplifying transistor AMI that corresponds to another transistor, the reset active region Ra (signal input/output section) of the reset transistor RST, and the drain region DR (signal input section) of a transfer transistor TX interposed therebetween.

The other elements of the present embodiment are substantially the same as those of the first embodiment. Therefore, they are designated by the same reference numerals and will not be redundantly described.

Figure 25:
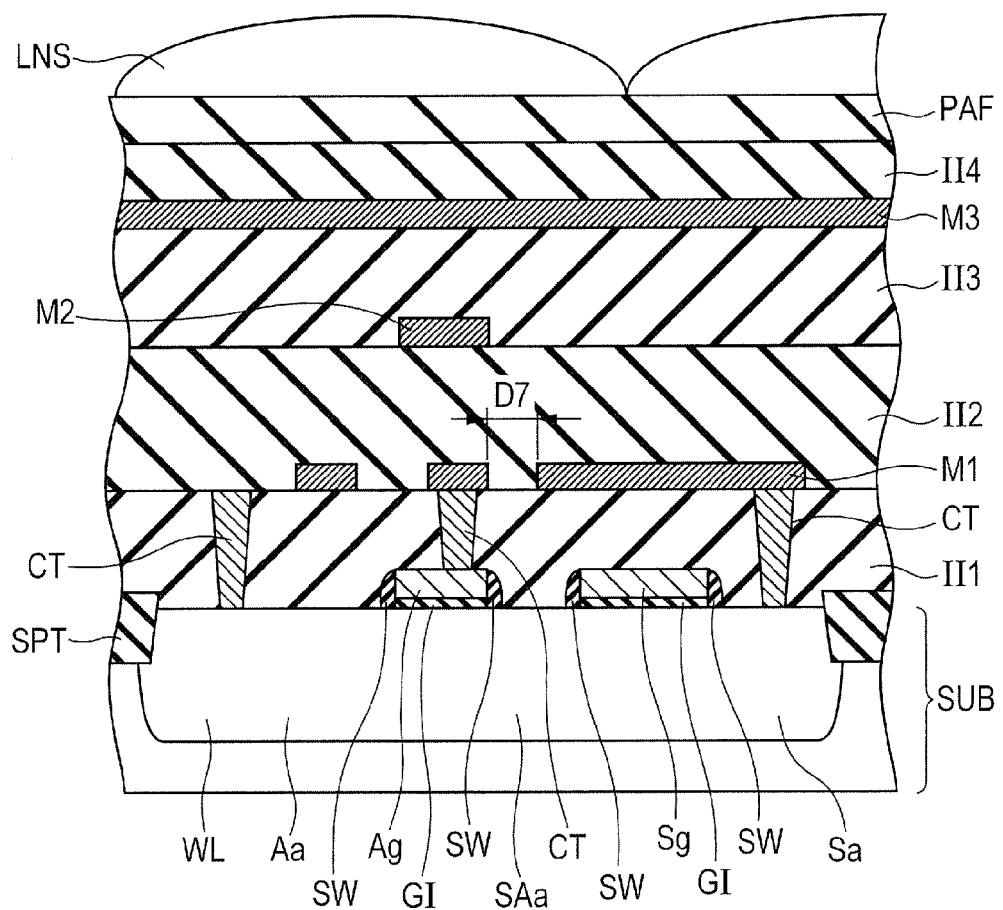
FIG. 25 is a schematic cross-sectional view of a portion taken along line XXV-XXV of FIG. 16.

Operational advantages of the present embodiment will now be described with reference to a comparative example shown in FIG. 25. Referring to FIG. 25, in the comparative example, the wiring M1 is electrically coupled, for instance, to the underlying amplifying gate electrode Ag by individual contacts CT, which are extended from the wiring M1 until they reach the underlying surfaces of terminals such as the region FD of the semiconductor device. In this instance, the distance D7 between a pair of neighboring wirings M1 in left-right direction of FIG. 25 may be reduced to increase the inter-wiring capacitance and short-circuit the pair of neighboring wirings M1.

As such being the case, when the shared contact SCT is used as described in conjunction with the present embodiment, the wiring M1 need not be formed directly above a region where the shared contact SCT is formed, as is the case with the first embodiment. In other words, the number of wirings M1 is smaller by one than in the comparative example. Therefore, the distance D8 (see FIG. 24B) between a pair of neighboring wirings in a region containing a region where the shared contact SCT is disposed can be made longer than the above-mentioned distance D7. Thus, in the present embodiment, the inter-wiring capacitance can be reduced to inhibit the wirings from being short-circuited. This makes it possible to improve the reliability of the semiconductor device and increase the degree of freedom in wiring layout. Further, the use of the above-described manufacturing method makes it possible to manufacture the semiconductor device whose reliability is improved in accordance with the present embodiment.

Fifth Embodiment

Figure 26:
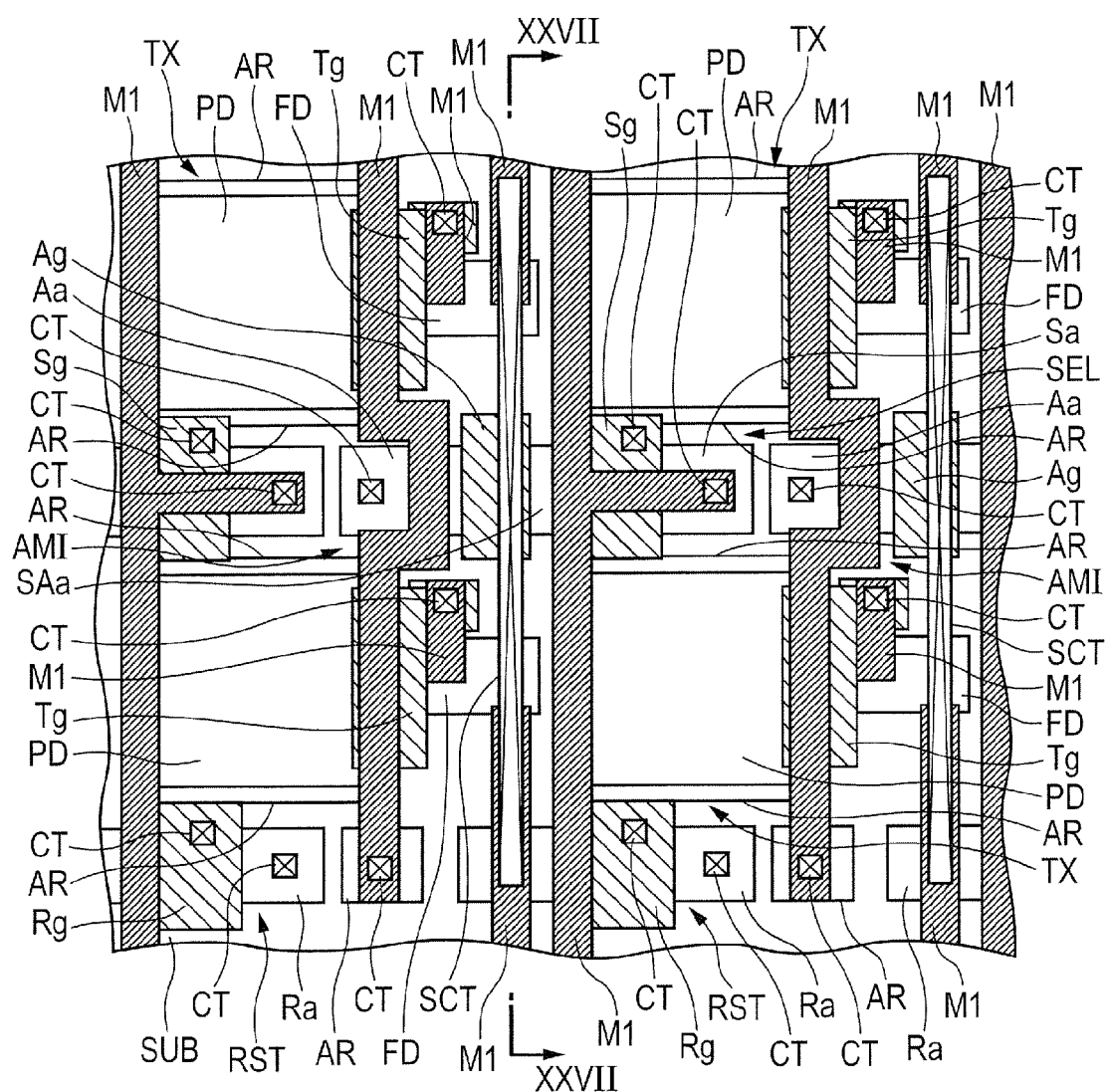
FIG. 26 is a schematic plan view illustrating a configuration of the pixel section according to a fifth embodiment of the present invention.
Figure 27:
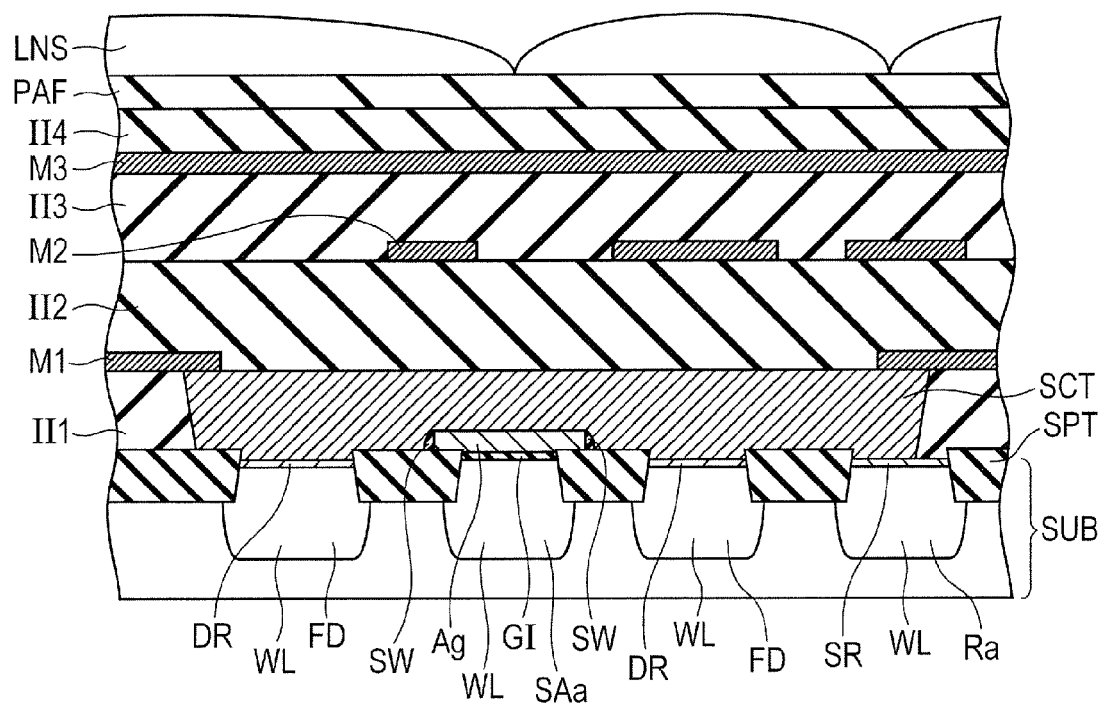
FIG. 27 is a schematic cross-sectional view of a portion taken along line XXVII-XXVII of FIG. 26.

Referring to FIGS. 26 and 27, the semiconductor device according to a fifth embodiment of the present invention is similar to the semiconductor device according to the foregoing embodiments in the layout of various transistors in the pixel section.

In the fifth embodiment, referring to FIG. 26, the upper left (upper right) one of the four arrayed regions FD, the amplifying gate electrode Ag of the amplifying transistor AMI, the lower left (lower right) one of the four arrayed regions FD, and a portion of the reset active region Ra are collinearly arranged in up-down direction of the figure. Further, four terminals (signal output and signal input/output sections), namely, the upper left (upper right) region FD, the amplifying gate electrode Ag, the lower left (lower right) region FD, and the reset active region Ra, are electrically coupled to each other by the shared contact SCT that serves as a coupling layer.

As described above, the shared contact SCT may couple a total of four or more of the signal input and signal input/output sections. Basically, the wiring M1 is not disposed directly above the shared contact SCT. The wiring M1 is coupled to only an end of the shared contact SCT in order to electrically couple the wiring M1 to the shared contact SCT. The wiring M1 is extended in accordance with an extension of the shared contact SCT.

The other elements of the present embodiment are substantially the same as those of the first embodiment. Therefore, they are designated by the same reference numerals and will not be redundantly described.

Operational advantages of the present embodiment will now be described. In the present embodiment, too, the distance between a pair of neighboring wirings M1 can be increased because the shared contact SCT is disposed, as is the case with the foregoing embodiments. Thus, an increase in the inter-wiring capacitance can be avoided to inhibit the wirings from being short-circuited. This makes it possible to improve the reliability of the semiconductor device and increase the degree of freedom in wiring layout. Further, when the number of terminals coupled by one shared contact SCT is increased, the efficiency of layout of individual transistors can be enhanced to simplify the configuration of the pixel section.

Sixth Embodiment

Figure 28:
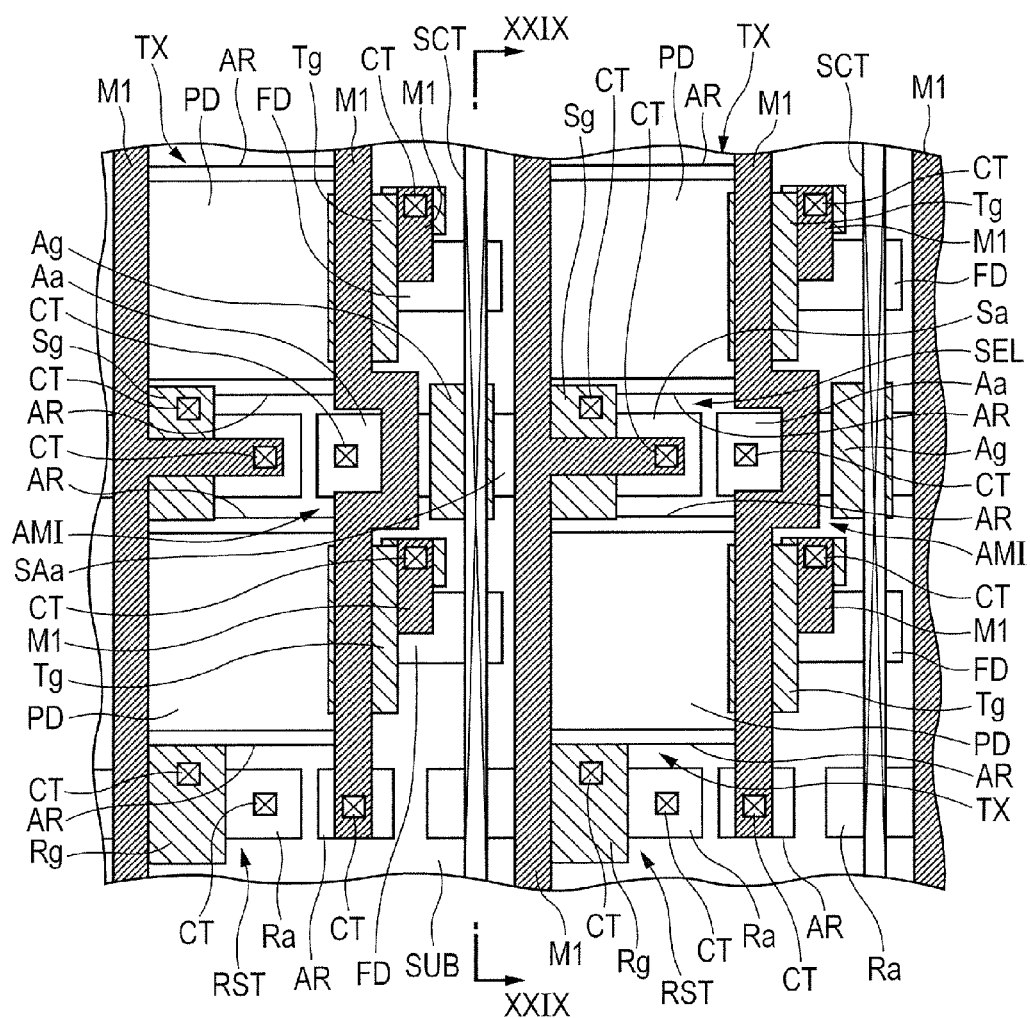
FIG. 28 is a schematic plan view illustrating a configuration of the pixel section according to a sixth embodiment of the present invention.
Figure 29:
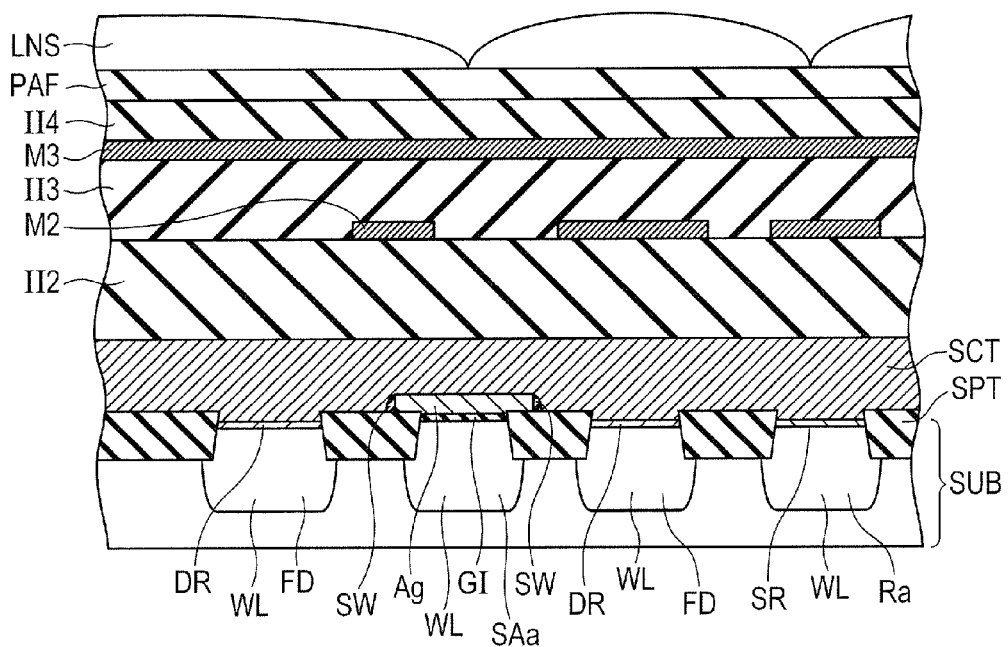
FIG. 29 is a schematic cross-sectional view of a portion taken along line XXIX-XXIX of FIG. 28.

Referring to FIGS. 28 and 29, the semiconductor device according to a sixth embodiment of the present invention is similar to the semiconductor device according to the foregoing embodiments in the layout of various transistors in the pixel section.

In the sixth embodiment, too, the upper left (upper right) region FD, the amplifying gate electrode Ag, the lower left (lower right) region FD, and a portion of the reset active region Ra are electrically coupled to each other by one shared contact SCT that serves as a coupling layer, as is the case with the fifth embodiment. Further, the pixel section in the sixth embodiment is configured so that the elements shown in FIGS. 28 and 29 are repeatedly disposed so that the overall configuration is formed, for instance, in a matrix format. The shared contact SCT is extended from a region (not shown in FIGS. 28 and 29) that is an extension of a region shown in FIGS. 28 and 29 to a region shown in FIGS. 28 and 29.

In other words, in the present embodiment, one shared contact SCT is formed so as to be coupled to and cover all of the region FD, the amplifying gate electrode Ag, and the reset active region Ra, which are terminals that are included in elements repeatedly disposed in a matrix format in a region including a region not shown in FIGS. 28 and 29 and disposed in accordance with an extension of the shared contact SCT shown in FIGS. 28 and 29. In still other words, in the present embodiment, one shared contact SCT is disposed to couple more terminals (at least five terminals) than the shared contact SCT in the fifth embodiment. Therefore, the wiring M1 need not be coupled to an end of the shared contact SCT.

The other elements of the present embodiment are substantially the same as those of the fifth embodiment. Therefore, they are designated by the same reference numerals and will not be redundantly described.

Operational advantages of the present embodiment will now be described. In the present embodiment, too, the distance between a pair of neighboring wirings M1 can be increased because the shared contact SCT is disposed, as is the case with the foregoing embodiments. Thus, an increase in the inter-wiring capacitance can be avoided to inhibit the wirings from being short-circuited. This makes it possible to improve the reliability of the semiconductor device and increase the degree of freedom in wiring layout. Further, the number of terminals coupled by one shared contact SCT is larger than in the fifth embodiment so that the shared contact SCT can be coupled to all terminals such as the region FD disposed in a region that overlaps with a region collinearly extended when viewed from above. This makes it possible to enhance the efficiency of layout of individual transistors and simplify the configuration of the pixel section.

Seventh Embodiment

First of all, the configuration of the pixel section in a seventh embodiment of the present invention will be described with reference to FIGS. 30, 31A, 31B, and 31C. For brevity of explanation, FIG. 31B excludes layers above the wiring M1, and FIG. 31C excludes layers above the interlayer insulating film I11.

Figure 30:
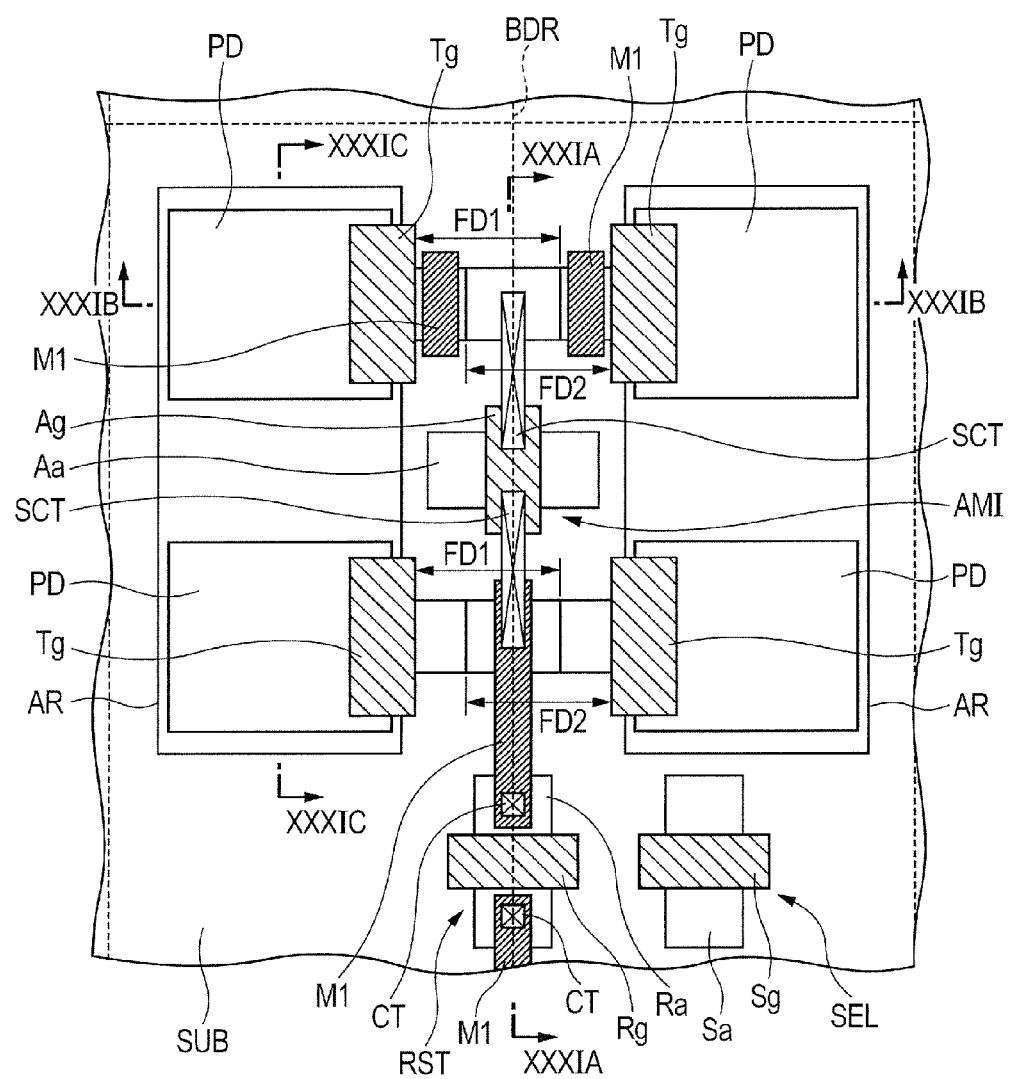
FIG. 30 is a schematic plan view illustrating a configuration of the pixel section according to a seventh embodiment of the present invention.

Referring to FIGS. 30, 31A, 31B, and 31C, the seventh embodiment is configured in the same manner as the foregoing embodiments so that, for example, four transfer transistors TX, one amplifying transistor AMI, one reset transistor RST, and one selection transistor SEL are disposed over the main surface of the semiconductor substrate SUB. Elements shown in FIG. 30 are repeatedly formed over the main surface of the semiconductor substrate SUB, for example, in a matrix format. A total of four transfer transistors TX, two vertical and two horizontal, are disposed in the region shown in FIG. 30.

The four transfer transistors each include the photodiode PD, the transfer gate electrode Tg, and the floating diffusion region FD. In the present embodiment, however, the upper left photodiode PD and lower left photodiode PD shown, for instance, in FIG. 30 are disposed in the same active region AR. Thus, these photodiodes PD have the cross-section shown, for instance, in FIG. 31C. Similarly, the upper right photodiode PD and lower right photodiode PD are also disposed in the same active region AR. In other words, the photodiodes PD are configured so that two photodiodes PD are disposed at intervals from each other in each of a plurality of active regions AR, which are formed at intervals from each other in the semiconductor substrate SUB. In this respect, the present embodiment differs in configuration from the first to sixth embodiments in which only one photodiode PD is formed in one active region AR.

It is conceivable that the surface of the semiconductor substrate SUB is divided by borderlines (broken lines) BDR in FIG. 30 into a plurality of pixel regions arranged in a matrix format. One active region AR is formed in each of the pixel regions. In the active region AR, two photodiodes PD are disposed at intervals from each other (vertically spaced apart from each other in the figure). Each of the two photodiodes PD is combined with the transfer gate electrode Tg and the floating diffusion region FD to form one transfer transistor TX.

Further, a floating diffusion region FD1 and a floating diffusion region FD2 partly overlap with each other. The floating diffusion region FD1 is an electric charge storage capacity region that is included in the transfer transistor TX having the upper left photodiode PD shown, for instance, in FIG. 30. The floating diffusion region FD2 is an electric charge storage capacity region that is included in the transfer transistor TX having the upper right photodiode PD shown in FIG. 30. In other words, as shown, for instance, in FIG. 31B, the active region AR forming the left transfer transistor TX and the active region AR forming the right transfer transistor TX overlap at least partly with each other.

When viewed from above, the region FD1 and the region FD2 may entirely (perfectly) overlap with each other. Alternatively, the present embodiment may be configured, as is the case with the first to sixth embodiments, so that the individual regions FD are all disposed on the same side as the transfer gate electrode Tg without overlapping with each other (although two photodiodes PD are disposed in one active region AR).

As described above, the floating diffusion regions FD1, FD2 of a pair of neighboring transfer transistors TX, which are disposed adjacent to each other in a direction (left-right direction of FIG. 30) intersecting the direction (up-down direction of FIG. 30) in which the two photodiodes PD disposed in one active region AR are arranged, overlap at least partly with each other. The floating diffusion regions FD1, FD2 are respectively shared by two transfer transistors TX that include the floating diffusion regions FD1, FD2 (are arranged in left-right direction of FIG. 30).

Here, the term "sharing" means that the same (single) amplifying transistor AMI performs a process of receiving electric signals from the two transfer transistors TX in a single pixel region and amplifying the received electric signals. In other words, the two transfer transistors in a single pixel region share the single amplifying transistor AMI.

Referring to FIG. 30, a region where the region FD1 of the upper left one of the four arrayed transfer transistors TX and the region FD2 of the upper right one of the four arrayed transfer transistors TX overlap with each other, the amplifying gate electrode Ag, a region where the region FD1 of the lower left one of the four arrayed transfer transistors TX and the region FD2 of the lower right one of the four arrayed transfer transistors TX overlap with each other, and a portion of the reset active region Ra are collinearly arranged in up-down direction of the figure. The regions FD1, FD2, which partly overlap with each other, and the amplifying gate electrode Ag are electrically coupled to each other by the shared contact SCT.

Similarly, the floating diffusion region FD1 included in the transfer transistor TX having the lower left photodiode PD shown, for instance, in FIG. 30 and the floating diffusion region FD2 included in the transfer transistor TX having the lower right photodiode PD shown in FIG. 30 partly overlap with each other. These regions FD1, FD2 are respectively shared by two transfer transistors (arranged in left-right direction of FIG. 30) having the regions FD1, FD2. Referring to FIG. 30, a region where the region FD1 of the lower left transfer transistor TX and the region FD2 of the lower right transfer transistor TX overlap with each other and the amplifying gate electrode Ag are electrically coupled to each other by the shared contact SCT.

Consequently, referring to FIG. 30, the present embodiment is configured so that the shared contact SCT couples the upper surfaces of a total of three regions, namely, the regions FD1, FD2 (signal output sections) overlapping at least partly with each other and a portion of the amplifying gate electrode Ag (signal input/output section) disposed adjacent to the regions FD1, FD2. As shown, for instance, in FIG. 31A, the shared contact SCT is electrically coupled to another transistor, such as the reset active region Ra, through the wiring M1 and the contact CT. In addition to the wiring M1 that is directly coupled to the shared contact SCT, a wiring M1 is disposed as appropriate as the same layer as the above-mentioned wiring M1 and extended in up-down direction of FIG. 30, as shown in FIGS. 30 and 31B.

In order to form the above-described configuration with ease, referring to FIG. 30, although the transfer gate electrode Tg is extended in up-down direction of the figure when viewed from above, the gate electrodes Ag, Rg, Sg of the other transistors (amplifying transistor AMI, reset transistor RST, and selection transistor SEL) are extended in left-right direction of the figure when viewed from above. As described above, the gate electrode of the transfer transistor TX and the gate electrodes of the other transistors may be extended in different directions that intersect with each other. Alternatively, however, the gate electrode of the transfer transistor TX and the gate electrodes of the other transistors may be extended in directions that are substantially parallel to each other, as is the case with the first to sixth embodiments.

The other elements of the present embodiment are substantially the same as those of the first embodiment. Therefore, they are designated by the same reference numerals and will not be redundantly described.

A method of forming the above-described pixel section, in particular, of the semiconductor device according to the present embodiment will now be described with reference to FIGS. 32 to 39.

Figure 32A:
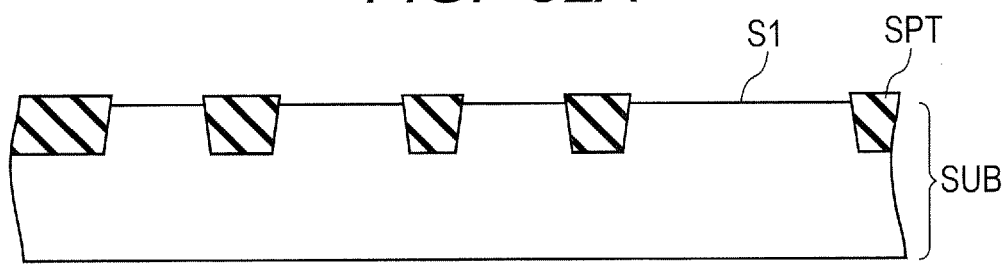
FIG. 32A is a schematic cross-sectional view illustrating the first process of the semiconductor device manufacturing method according to the seventh embodiment in a portion taken along line XXXIA-XXXIA of FIG. 30.
Figure 32B:
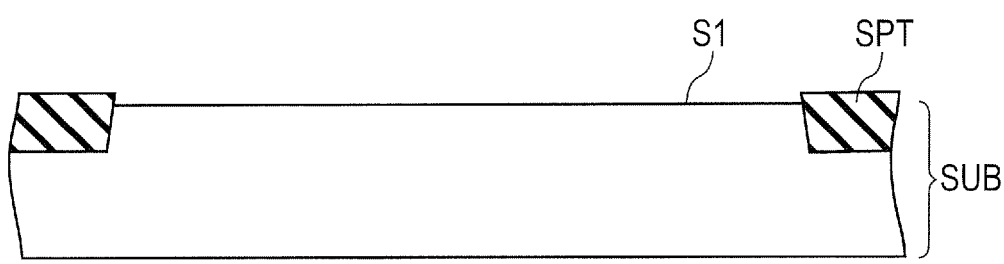
FIG. 32B is a schematic cross-sectional view illustrating the first process of the semiconductor device manufacturing method according to the seventh embodiment in a portion taken along line XXXIB-XXXIB of FIG. 30.
Figure 32C:
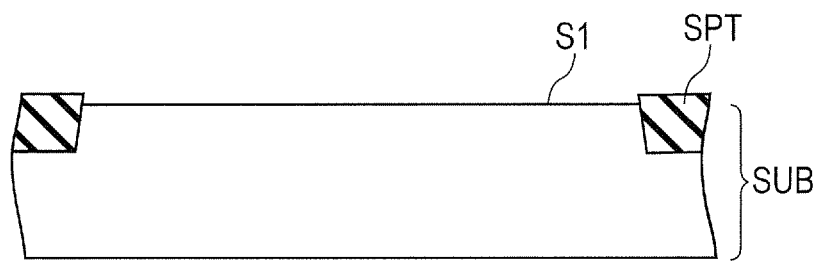
FIG. 32C is a schematic cross-sectional view illustrating the first process of the semiconductor device manufacturing method according to the seventh embodiment in a portion taken along line XXXIC-XXXIC of FIG. 30.

Referring to FIGS. 32A, 32B, and 32C, the semiconductor substrate SUB is prepared in the same manner as indicated in FIGS. 6A and 6B. Meanwhile, the separating insulating film SPT is formed, for example, over the upper main surface S1 in order to separate the upper main surface S1 into regions where the individual transistors are formed.

Figure 33A:
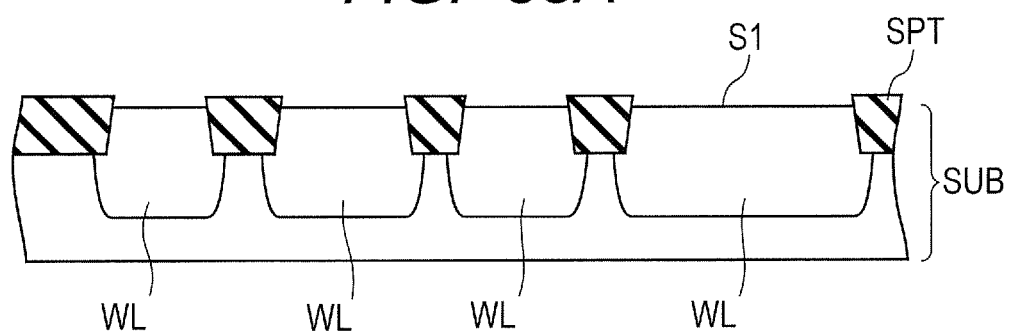
FIG. 33A is a schematic cross-sectional view illustrating the second process of the semiconductor device manufacturing method according to the seventh embodiment in the portion taken along line XXXIA-XXXIA of FIG. 30.
Figure 33B:
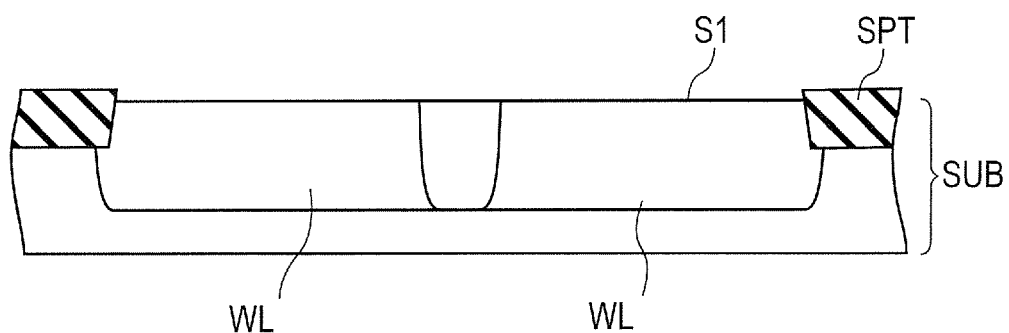
FIG. 33B is a schematic cross-sectional view illustrating the second process of the semiconductor device manufacturing method according to the seventh embodiment in the portion taken along line XXXIB-XXXIB of FIG. 30.
Figure 33C:
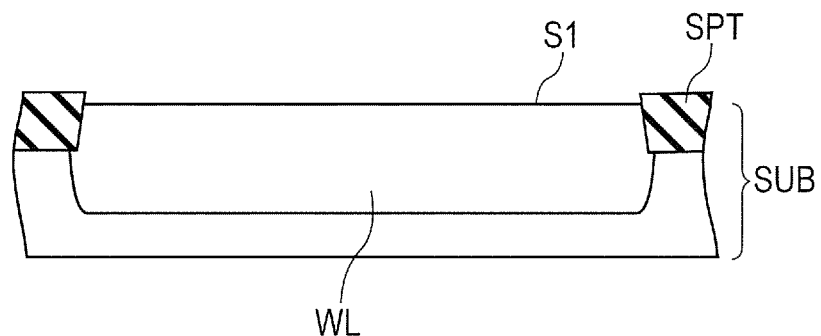
FIG. 33C is a schematic cross-sectional view illustrating the second process of the semiconductor device manufacturing method according to the seventh embodiment in the portion taken along line XXXIC-XXXIC of FIG. 30.

Referring to FIGS. 33A, 33B, and 33C, a plurality of well regions WL are formed at intervals from each other in the semiconductor substrate SUB in the same manner as indicated in FIGS. 7A and 7b. As shown in FIG. 33B, the well regions WL may be formed in an overlapping manner within a region where the later-formed floating diffusion regions FD1, FD2 overlap with each other. The well regions WL function as a base for configuring, for instance, a plurality of later-formed active regions AR.

Figure 34A:
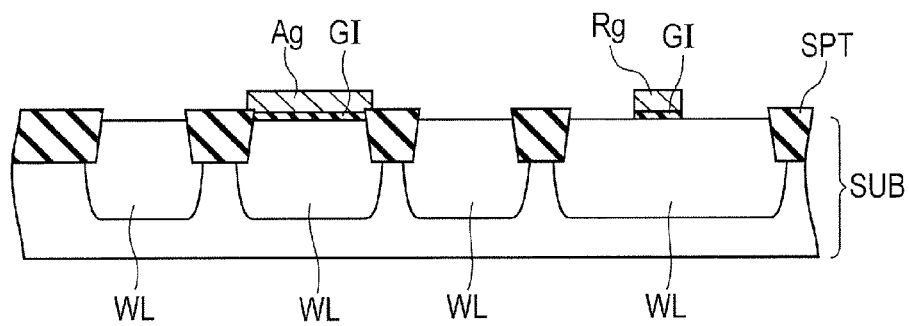
FIG. 34A is a schematic cross-sectional view illustrating the third process of the semiconductor device manufacturing method according to the seventh embodiment in the portion taken along line XXXIA-XXXIA of FIG. 30.
Figure 34B:
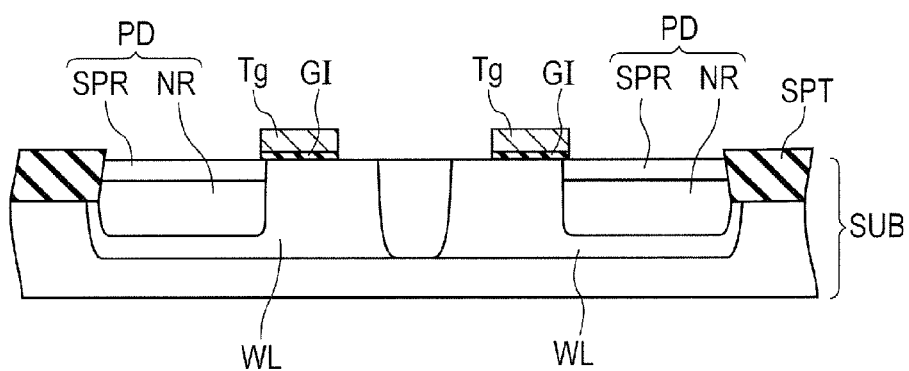
FIG. 34B is a schematic cross-sectional view illustrating the third process of the semiconductor device manufacturing method according to the seventh embodiment in the portion taken along line XXXIB-XXXIB of FIG. 30.
Figure 34C:
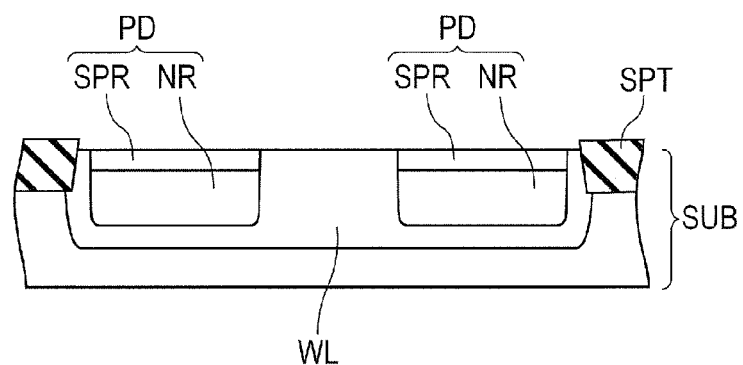
FIG. 34C is a schematic cross-sectional view illustrating the third process of the semiconductor device manufacturing method according to the seventh embodiment in the portion taken along line XXXIC-XXXIC of FIG. 30.

Referring to FIGS. 34A, 34B, and 34C, in the same manner as indicated in FIGS. 8A and 8B, various gate electrodes and the gate insulating film GI, which is in contact with the underside of each of the gate electrodes, are formed, and the photodiode PD including the surface p-type region SPR and the n-type region NR is formed. In this instance, as shown particularly in FIG. 34C, two photodiodes PD are formed at intervals from each other in one well region WL (for forming the active region AR). In the subsequent process description, the region shown in FIG. 34C is excluded.

Figure 35A:
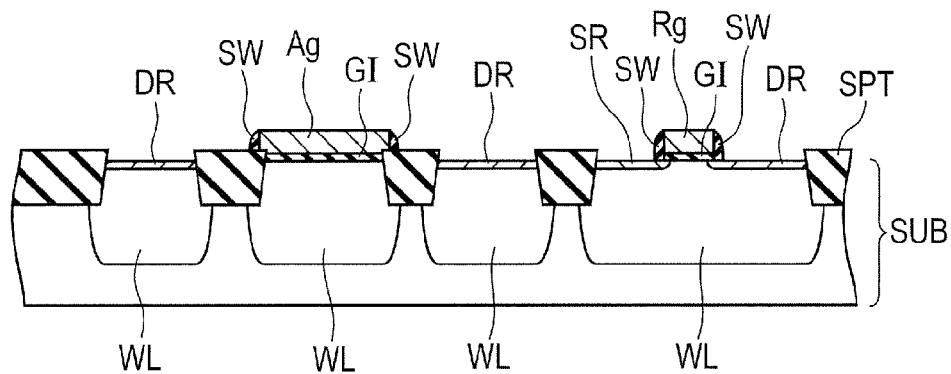
FIG. 35A is a schematic cross-sectional view illustrating the fourth process of the semiconductor device manufacturing method according to the seventh embodiment in the portion taken along line XXXIA-XXXIA of FIG. 30.
Figure 35B:
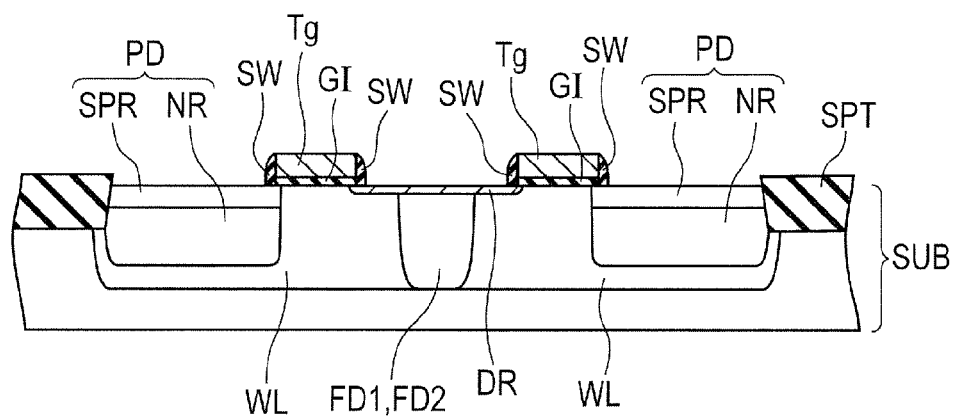
FIG. 35B is a schematic cross-sectional view illustrating the fourth process of the semiconductor device manufacturing method according to the seventh embodiment in the portion taken along line XXXIB-XXXIB of FIG. 30.

Referring to FIGS. 35A and 35B, in the same manner as indicated in FIGS. 9A and 9B, the source region SR and drain region DR of each transistor are formed, and the drain region DR of a region in which the transfer transistor TX is formed is formed as the floating diffusion regions FD1, FD2 of the photodiode PD. The various transistors are now completed.

Figure 36A:
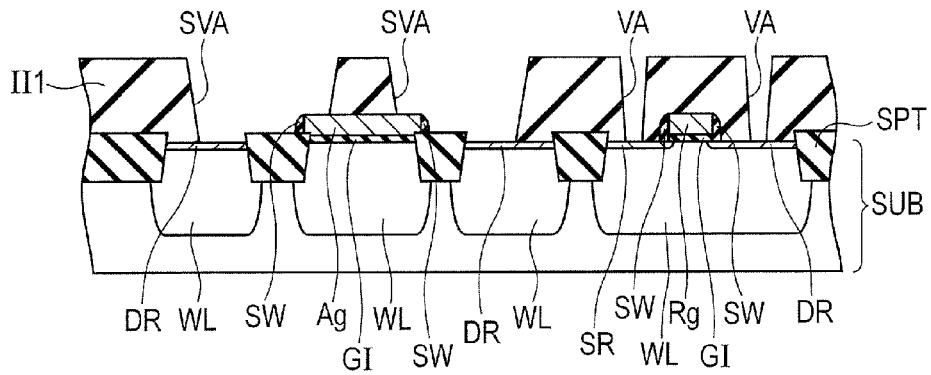
FIG. 36A is a schematic cross-sectional view illustrating the fifth process of the semiconductor device manufacturing method according to the seventh embodiment in the portion taken along line XXXIA-XXXIA of FIG. 30.
Figure 36B:
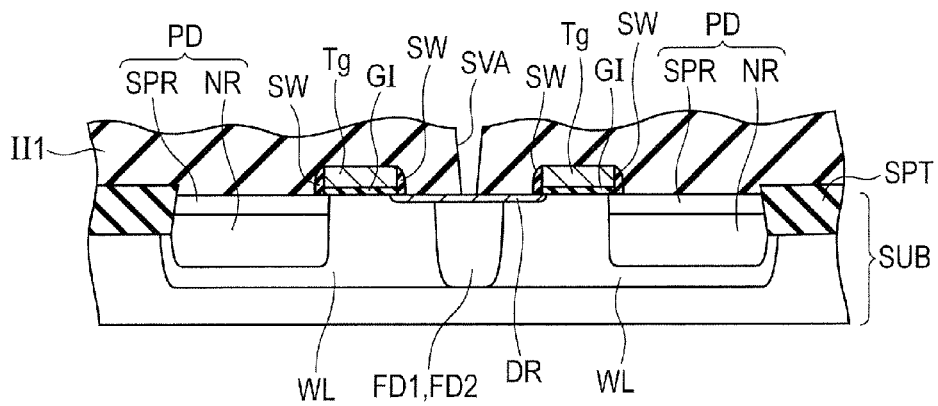
FIG. 36B is a schematic cross-sectional view illustrating the fifth process of the semiconductor device manufacturing method according to the seventh embodiment in the portion taken along line XXXIB-XXXIB of FIG. 30.

Referring to FIGS. 36A and 36B, in the same manner as indicated in FIGS. 10A and 10B, the interlayer insulating film II1 made of silicon oxide film is formed so as to cover the various formed transistors, and the via VA and the shared via SVA are formed in the interlayer insulating film II1. In the subsequent process description, the region shown in FIG. 36B is excluded.

Figure 37:
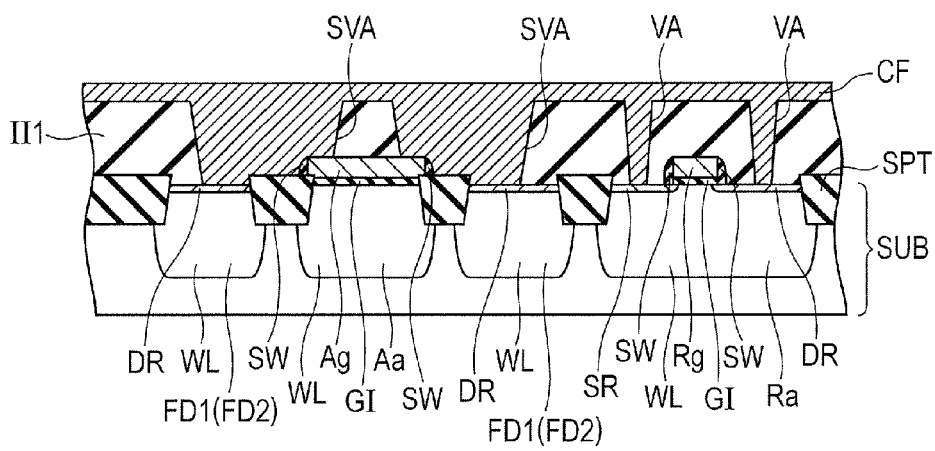
FIG. 37 is a schematic cross-sectional view illustrating the sixth process of the semiconductor device manufacturing method according to the seventh embodiment in the portion taken along line XXXIA-XXXIA of FIG. 30.
Figure 38:
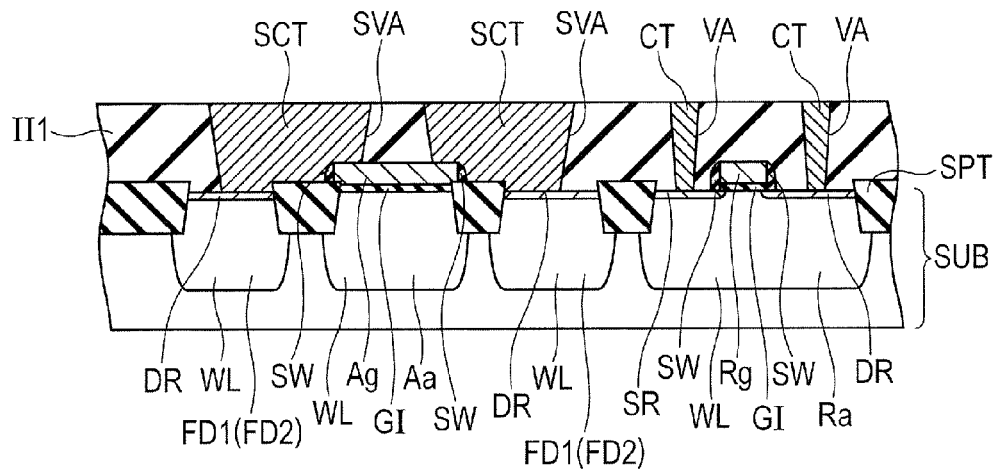
FIG. 38 is a schematic cross-sectional view illustrating the seventh process of the semiconductor device manufacturing method according to the seventh embodiment in the portion taken along line XXXIA-XXXIA of FIG. 30.
Figure 39:
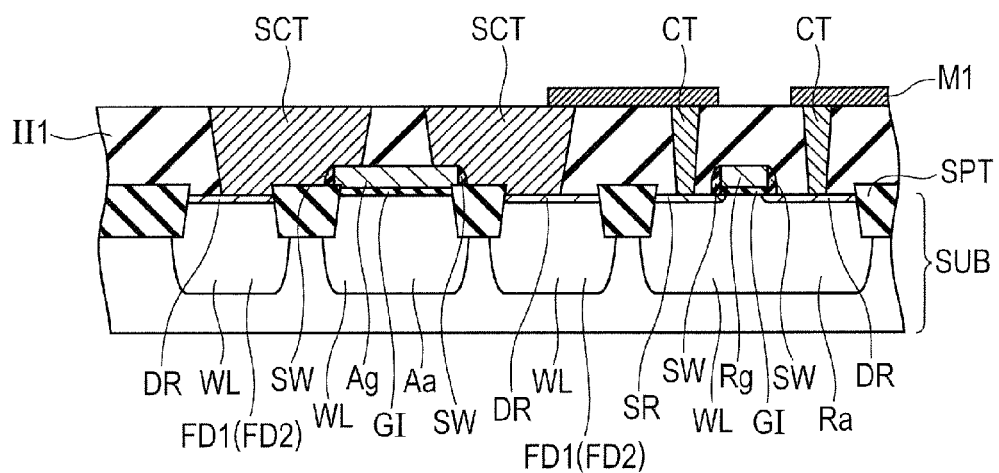
FIG. 39 is a schematic cross-sectional view illustrating the eighth process of the semiconductor device manufacturing method according to the seventh embodiment in the portion taken along line XXXIA-XXXIA of FIG. 30.

Referring to FIGS. 37 to 39, in the same manner as indicated in FIGS. 11 to 13, the conductive film CF is filled, for instance, into the shared via so as to form the contact CT and the shared contact SCT. A pattern of the wiring M1 made, for instance, of aluminum is formed over the interlayer insulating film II1 in such a manner that the pattern is open above the upper surface of the shared contact SCT.

Figure 31A:
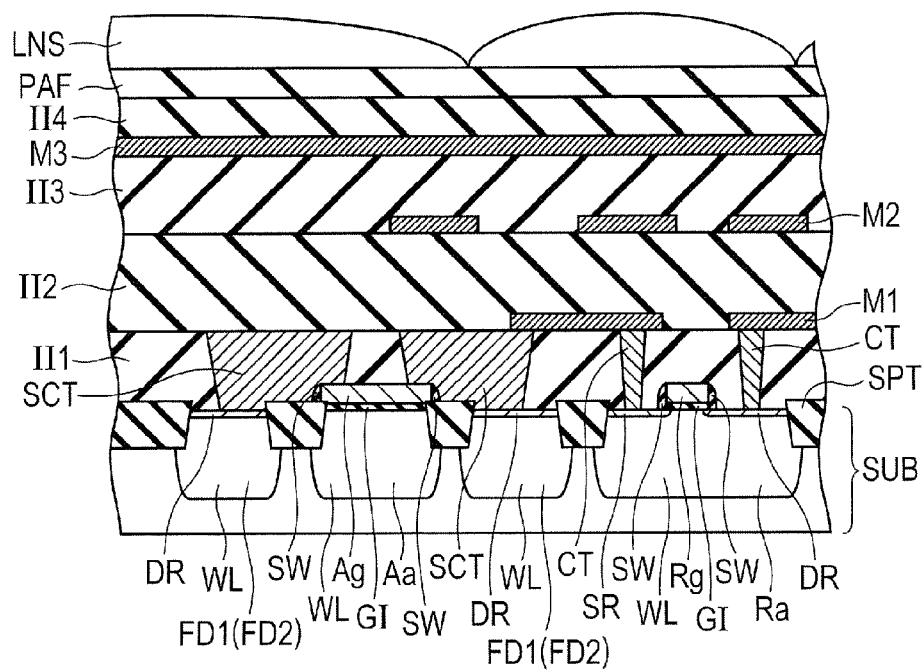
FIG. 31A is a schematic cross-sectional view of a portion taken along line XXXIA-XXXIA of FIG. 30.
Figure 31B:
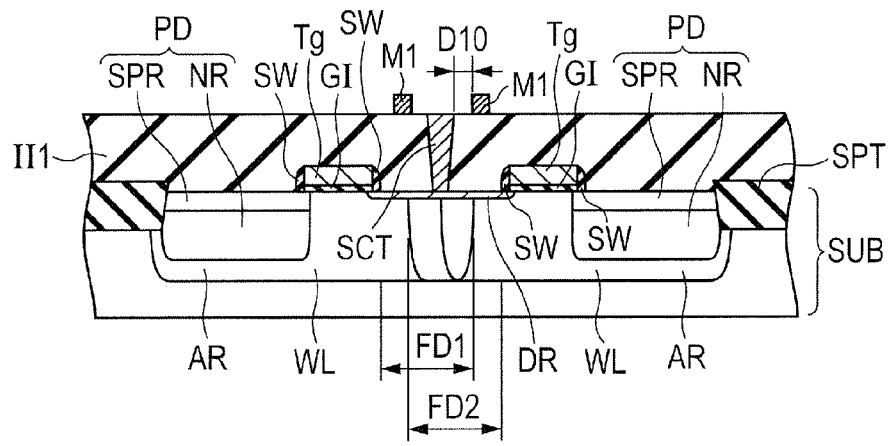
FIG. 31B is a schematic cross-sectional view of a portion taken along line XXXIB-XXXIB of FIG. 30.
Figure 31C:
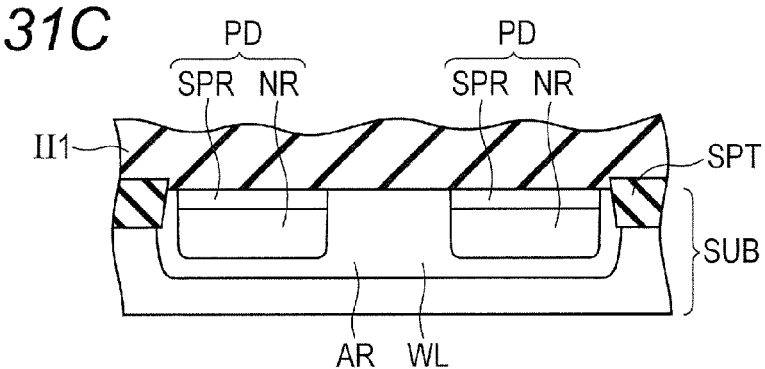
FIG. 31C is a schematic cross-sectional view of a portion taken along line XXXIC-XXXIC of FIG. 30.

Referring to FIG. 31A, the same process is performed as indicated in FIGS. 14 and 15 to form, for example, the interlayer insulating films II2-II4 and the wirings M2, M3. As a result, a plurality of image sensors are formed as semiconductor devices having the pixel section shown in FIG. 30.

Operational advantages of the present embodiment will now be described with reference to a comparative example shown in FIGS. 40, 41A, and 41B.

Figure 40:
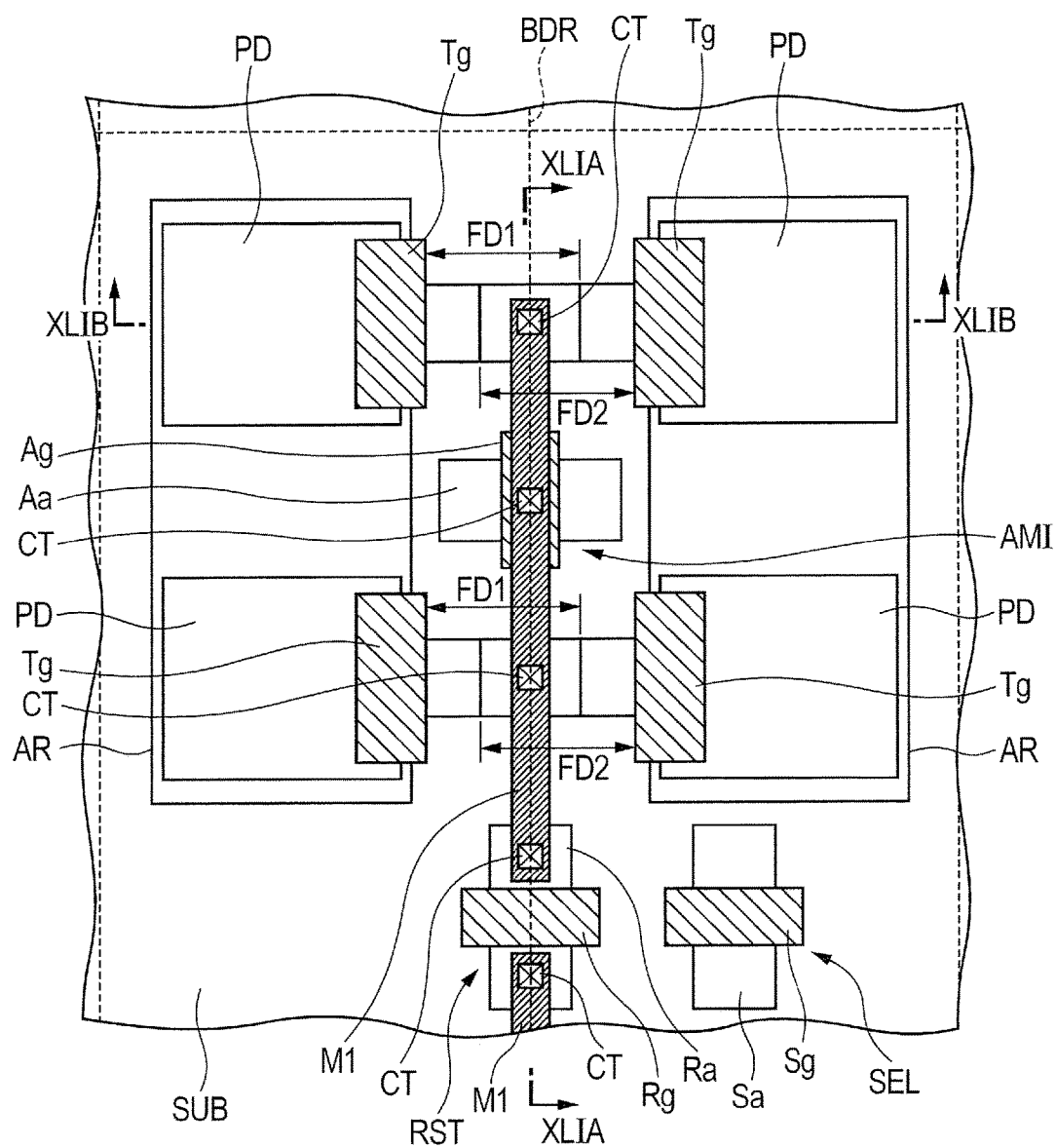
FIG. 40 is a schematic plan view illustrating a configuration of the pixel section of a comparative example of the seventh embodiment.
Figure 41A:
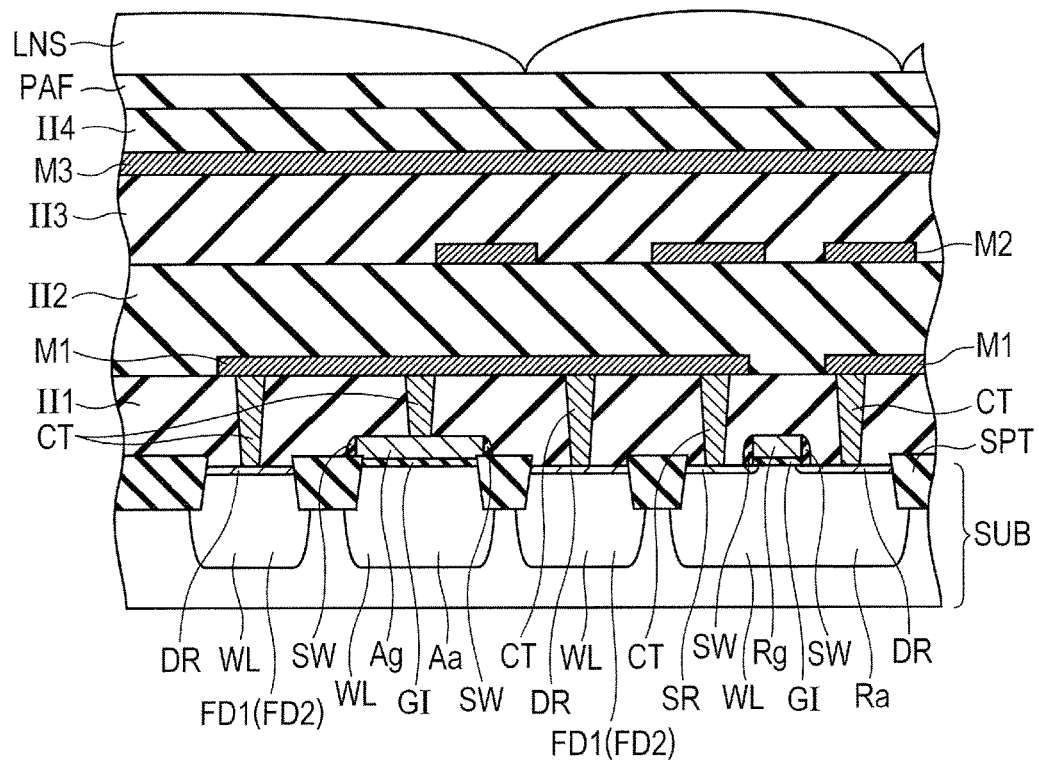
FIG. 41A is a schematic cross-sectional view taken along line XLIA-XLIA of FIG. 40.
Figure 41B:
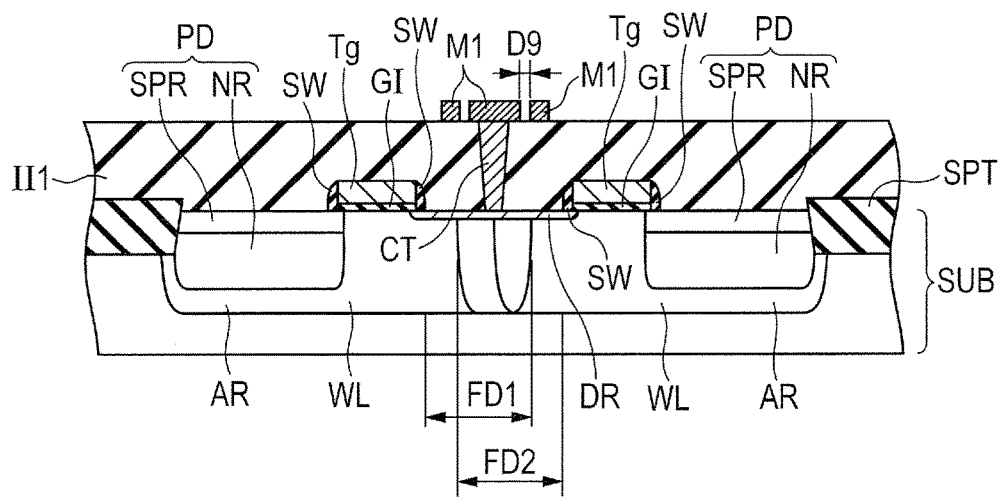
FIG. 41B is a schematic cross-sectional view taken along line XLIB-XLIB of FIG. 40.

Referring to FIGS. 40, 41A, and 41B, the pixel section of the comparative example has basically the same configuration as that of the present embodiment. Thus, referring to FIG. 40, a region where the region FD1 of the upper left one of the four arrayed transfer transistors TX and the region FD2 of the upper right one of the four arrayed transfer transistors TX overlap with each other, the amplifying gate electrode Ag, a region where the region FD1 of the lower left one of the four arrayed transfer transistors TX and the region FD2 of the lower right one of the four arrayed transfer transistors TX overlap with each other, and a portion of the reset active region Ra are collinearly arranged in up-down direction of the figure.

In the comparative example, however, the contacts CT are extended upward from the surfaces of the above terminals, and these contacts CT are electrically coupled to the wiring M1 that is disposed above (in the layer above) the contacts CT and extended in up-down direction of the figure. In other words, the wiring M1 is electrically coupled, for instance, to the above-mentioned regions FD by the contacts CT that are extended downward within the interlayer insulating film II1 from the wiring M1. This configuration is the same as the configuration of the comparative example shown, for instance, in FIG. 16.

In this case, as shown in FIG. 41B, when particularly the photodiode PD and the like are progressively miniaturized, the distance D9 between a pair of neighboring wirings M1 as viewed in left-right direction of the figure becomes shorter. Inter-wiring capacitance is unintentionally formed by the pair of wirings M1 and the interlayer insulating film II2 interposed therebetween.

As such being the case, the present embodiment is configured so that a total of three regions, namely, the two floating diffusion regions FD1, FD2 overlapping at least partly with each other and the amplifying gate electrode Ag disposed adjacent to the floating diffusion regions FD1, FD2, are electrically coupled to each other by the shared contact SCT that serves as a coupling layer.

Basically, the wiring M1 need not be formed directly above the shared contact SCT. Thus, due to the existence of the shared contact SCT, the number of wirings M1 is smaller by one than in the comparative example as indicated in FIG. 31B. Therefore, the distance D10 between a pair of neighboring wirings disposed in left-right direction of the figure can be made longer than the distance D9 in the comparative example. Thus, in the present embodiment, too, an increase in the inter-wiring capacitance can be avoided to inhibit the wirings from being short-circuited and increase the degree of freedom in wiring layout, as is the case with the other embodiments. These operational advantages are obtained no matter whether only one photodiode PD is disposed in one active region AR or two photodiodes PD are disposed in one active region AR.

Further, as shown in FIG. 30, the floating diffusion regions FD1, FD2 of two transfer transistors TX partly overlap with each other. This makes it possible to reduce the area of the main surface of the semiconductor substrate SUB that is occupied by the transfer transistors TX. Thus, the layout of the semiconductor device can be further reduced. As a result, the semiconductor device can be further miniaturized.

Eighth Embodiment

Figure 42:
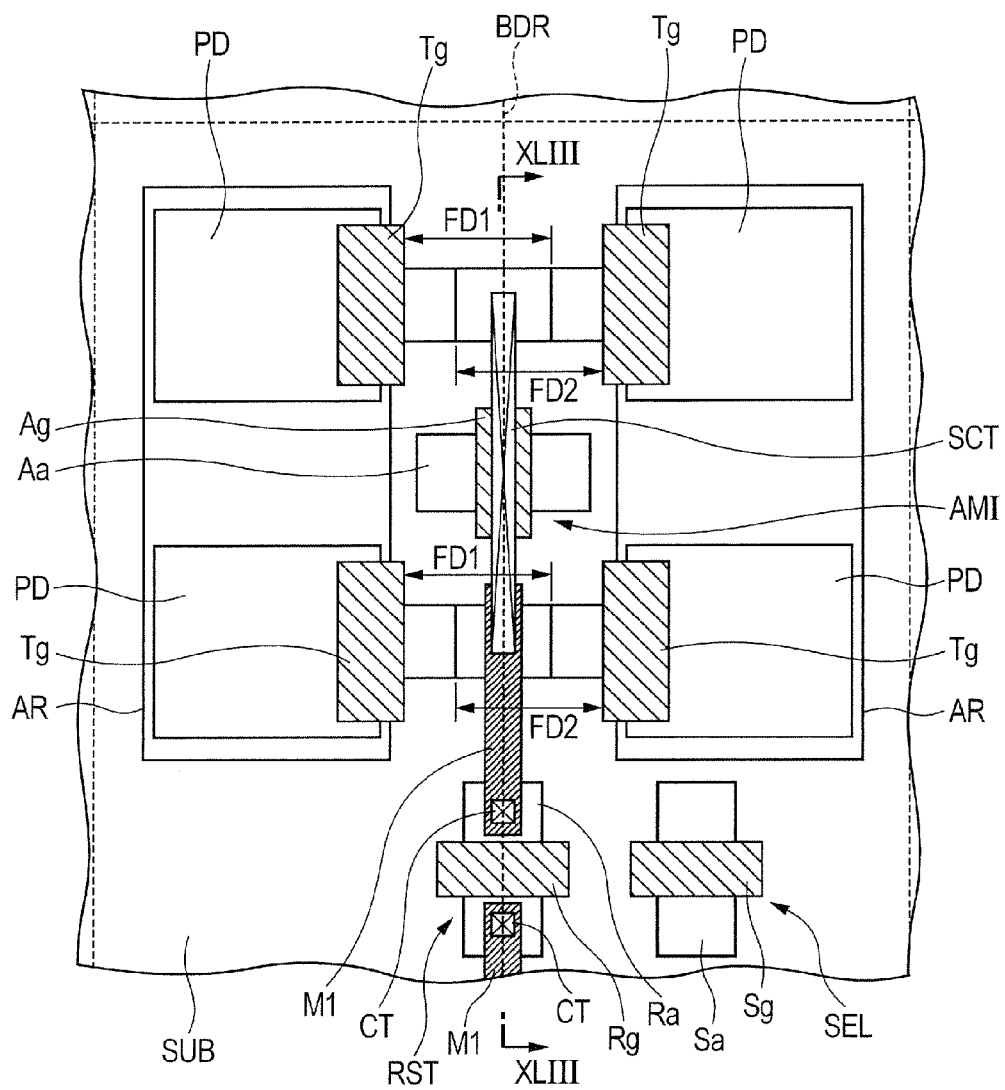
FIG. 42 is a schematic plan view illustrating a configuration of the pixel section according to an eighth embodiment of the present invention.
Figure 43:
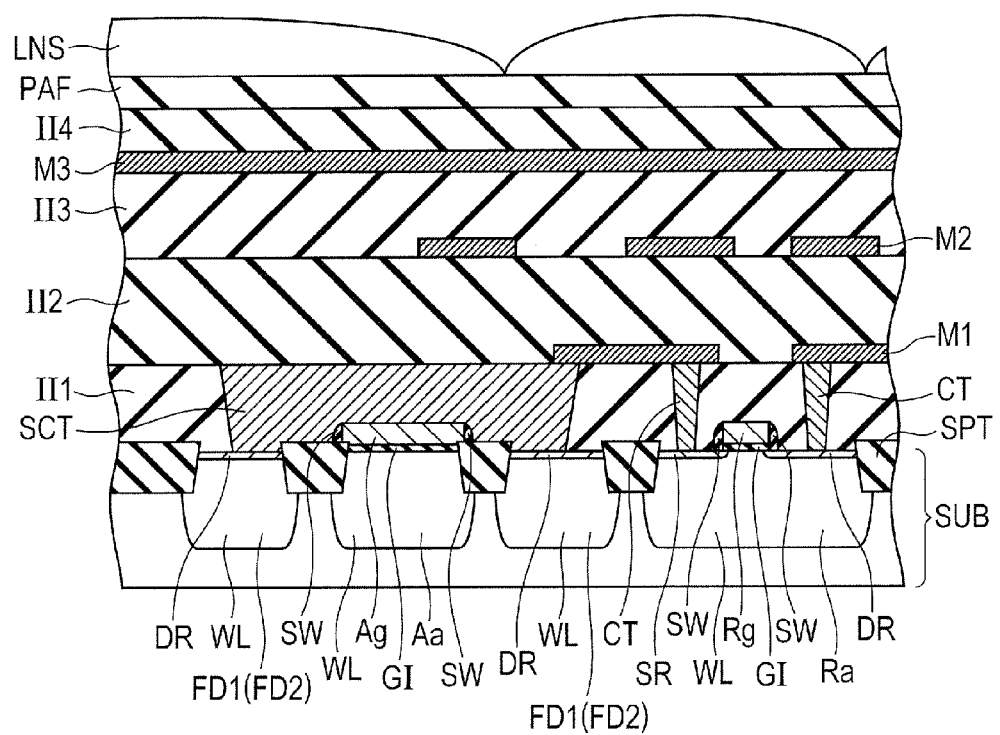
FIG. 43 is a schematic cross-sectional view taken along line XLIII-XLIII of FIG. 42.

Referring to FIGS. 42 and 43, the semiconductor device according to an eighth embodiment of the present invention is similar to the semiconductor device according to the seventh embodiment in the layout of various transistors in the pixel section.

In the eighth embodiment, too, a region where the region FD1 of the upper left one of the four arrayed transfer transistors TX and the region FD2 of the upper right one of the four arrayed transfer transistors TX overlap with each other, the amplifying gate electrode Ag, a region where the region FD1 of the lower left one of the four arrayed transfer transistors TX and the region FD2 of the lower right one of the four arrayed transfer transistors TX overlap with each other, and a portion of the reset active region Ra are collinearly arranged in up-down direction of the figure.

Further, the upper surfaces of a total of five regions, namely, the regions FD1, FD2 overlapping partly with each other, the amplifying gate electrode Ag, and the other regions FD1, FD2 overlapping partly with each other, are electrically coupled to each other by the shared contact SCT. In other words, all the floating diffusion regions FD of the four transfer transistors TX shown in FIG. 42 and the amplifying gate electrode Ag disposed between the two overlapping regions FD1, FD2 formed at intervals from each other are all coupled and covered by one shared contact SCT. This shared contact SCT is electrically coupled, for instance, to the reset active region Ra through the wiring M1 and the contact CT.

The other elements of the present embodiment are substantially the same as those of the seventh embodiment. Therefore, they are designated by the same reference numerals and will not be redundantly described.

Operational advantages of the present embodiment will now be described. As the shared contact SCT is disposed in the present embodiment, too, it is possible to avoid an increase in the inter-wiring capacitance, inhibit the wirings from being short-circuited, improve the reliability of the semiconductor device, and increase the degree of freedom in wiring layout, as is the case with the seventh embodiment. Further, the number of terminals coupled to one shared contact is increased to be larger than in the seventh embodiment. This makes it possible to enhance the efficiency of layout of individual transistors and simplify the configuration of the pixel section.

Ninth Embodiment

Figure 44:
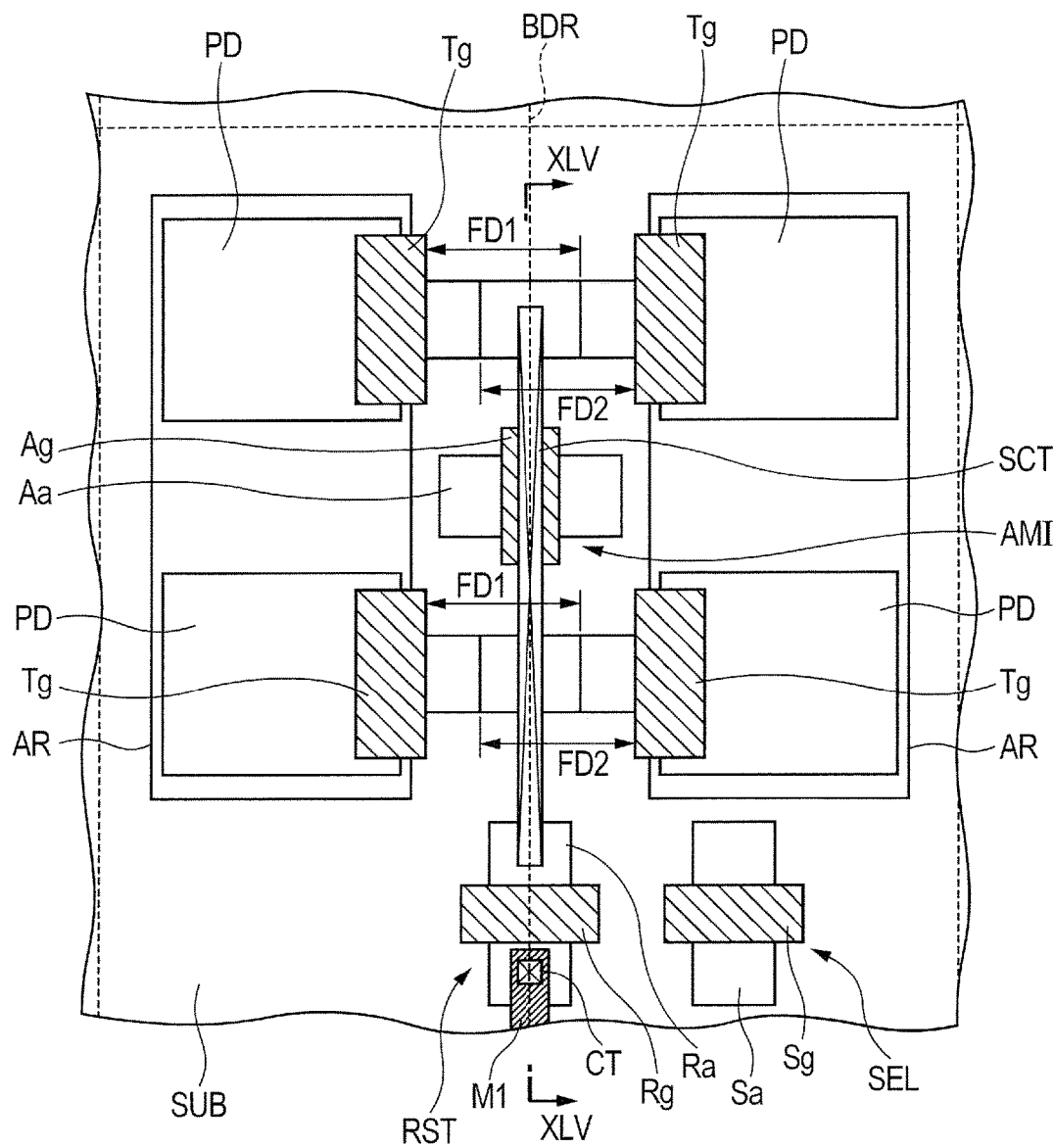
FIG. 44 is a schematic plan view illustrating a configuration of the pixel section according to a ninth embodiment of the present invention.
Figure 45:
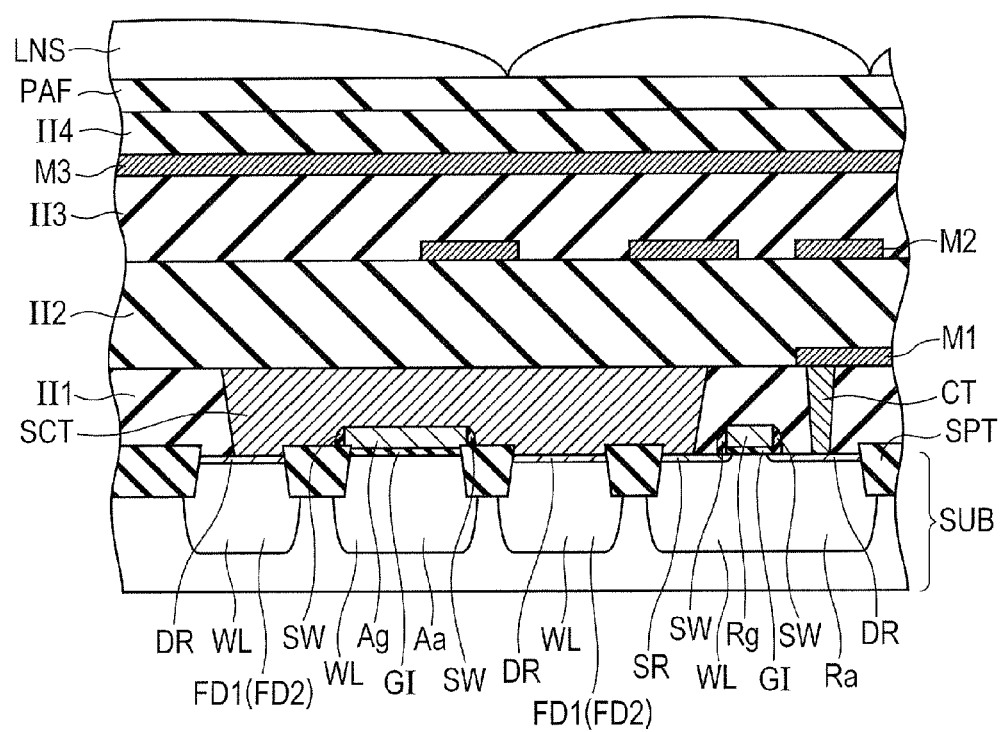
FIG. 45 is a schematic cross-sectional view taken along line XLV-XLV of FIG. 44.

Referring to FIGS. 44 and 45, a ninth embodiment of the present invention is configured so that the shared contact SCT described in conjunction with the eighth embodiment is disposed to electrically couple the reset active region Ra as well. More specifically, referring to FIG. 44, the upper surfaces of a total of six regions, namely, the floating diffusion regions FD1, FD2 of the four transfer transistors TX, the amplifying gate electrode Ag interposed therebetween, and the reset active region Ra disposed outside the above-mentioned regions, are electrically coupled to each other by the shared contact SCT.

The other elements of the ninth embodiment are substantially the same as those of the eighth embodiment. Therefore, they are designated by the same reference numerals and will not be redundantly described.

Operational advantages of the present embodiment will now be described. As the shared contact SCT is disposed in the present embodiment, too, it is possible to avoid an increase in the inter-wiring capacitance, inhibit the wirings from being short-circuited, improve the reliability of the semiconductor device, and increase the degree of freedom in wiring layout, as is the case with the seventh and eighth embodiments. Further, the number of terminals coupled to one shared contact is increased to be larger than in the eighth embodiment. This makes it possible to further enhance the efficiency of layout of individual transistors and further simplify the configuration of the pixel section.

While the embodiments of the present invention contemplated by its inventors have been described in detail, the present invention is not limited to the specific embodiments described above. It is to be understood that various modifications of the present invention may be made without departing from the spirit and scope of the present invention.

What is claimed is:

1. A semiconductor device comprising:
a semiconductor substrate having a main surface;
a plurality of transfer transistors that are formed over the main surface in such a manner as to include a photoelectric conversion element and a signal output section that are formed in the semiconductor substrate; and
a plurality of other transistors that are formed over the main surface so as to be electrically coupled to the transfer transistors and include at least one signal input/output section,
wherein an interlayer insulating film is formed so as to cover the transfer transistors and the other transistors,
wherein at least three of at least one unit of the signal output section of the transfer transistors and at least one unit of the signal input/output section of the other transistors are coupled with a coupling layer that includes a conductor filled into a single groove formed in the interlayer insulating film, and wherein the conductor physically contacts the at least three of the at least one unit of the signal output section of the transfer transistors and the at least one unit of the signal input/output section of the other transistors formed.

2. The semiconductor device according to claim 1,
wherein the signal output section is an electric charge storage capacity region that is included in each of two neighboring ones of the transfer transistors, and wherein the signal input/output section is disposed between the two electric charge storage capacity regions and is a gate electrode of one amplifying transistor that is one of the other transistors.

3. The semiconductor device according to claim 1,
wherein two units of the photoelectric conversion element are disposed at intervals from each other in each of a plurality of active regions formed in the semiconductor substrate.

4. The semiconductor device according to claim 3,
wherein the signal output section is included in each of two neighboring ones of the transfer transistors and is a pair of electric charge storage capacity regions that overlap at least partly with each other, and wherein the signal input/output section is disposed adjacent to the pair of electric charge storage capacity regions and is a gate electrode of one amplifying transistor that is one of the other transistors.

5. The semiconductor device according to claim 1,
wherein the sidewall of the coupling layer is oriented from one main surface of the interlayer insulating film to the other main surface opposing the one main surface and is extended in a direction inclined from a direction perpendicular to the one main surface.

6. A semiconductor device comprising:
a semiconductor substrate having a main surface;
a plurality of transfer transistors that are formed over the main surface in such a manner as to include a photoelectric conversion element and a signal output section that are formed in the semiconductor substrate; and
a plurality of other transistors that are formed over the main surface so as to be electrically coupled to the transfer transistors and include at least one signal input/output section, wherein an interlayer insulating film is formed so as to cover the transfer transistors and the other transistors, and wherein at least three of at least one unit of the signal output section of the transfer transistors and at least one unit of the signal input/output section of the other transistors are coupled with a coupling layer that includes a conductor filled into a groove formed in the interlayer insulating film, wherein two units of the photoelectric conversion element are disposed at intervals from each other in each of a plurality of active regions formed in the semiconductor substrate, wherein the signal output section is included in each of two neighboring ones of the transfer transistors and is a pair of electric charge storage capacity regions that overlap at least partly with each other, and wherein the signal input/output section is disposed adjacent to the pair of electric charge storage capacity regions and is a gate electrode of one amplifying transistor that is one of the other transistors.

* * * * *